(12) United States Patent
Chen

(10) Patent No.: US 11,373,599 B1
(45) Date of Patent: Jun. 28, 2022

(54) ARRAY SUBSTRATE, DISPLAY PANEL AND DISPLAY DEVICE

(71) Applicants: Wuhan Tianma Micro-Electronics Co., Ltd., Wuhan (CN); Wuhan Tianma MicroElectronics Co., Ltd. Shanghai Branch, Shanghai (CN)

(72) Inventor: Xian Chen, Shanghai (CN)

(73) Assignees: Wuhan Tianma Micro-Electronics Co., Ltd., Wuhan (CN); Wuhan Tianma MicroElectronics Co., Ltd. Shanghai Branch, Shanghai (CN)

( * ) Notice: Subject to any disclaimer, the term of this patent is extended or adjusted under 35 U.S.C. 154(b) by 0 days.

(21) Appl. No.: 17/323,149

(22) Filed: May 18, 2021

(30) Foreign Application Priority Data

Mar. 9, 2021 (CN) .......................... 202110255288.7

(51) Int. Cl.
*G09G 3/3258* (2016.01)
*H01L 27/32* (2006.01)
*G09G 3/3291* (2016.01)

(52) U.S. Cl.
CPC .......... *G09G 3/3258* (2013.01); *G09G 3/3291* (2013.01); *H01L 27/3262* (2013.01); *H01L 27/3265* (2013.01); *H01L 27/3276* (2013.01)

(58) Field of Classification Search
CPC ........ G09G 3/3283; G09G 3/325; G09G 3/00; G09G 3/3241; G09G 2330/12; G09G 2310/0283; G09G 2310/0256; G09G 2300/0866; G09G 3/20; G09G 2320/0606; G09G 2320/066; G09G 3/3266; H01L 27/3244; H01L 27/3223; H01L 51/5262; H01L 51/5259
See application file for complete search history.

(56) References Cited

U.S. PATENT DOCUMENTS

| 2005/0012706 A1* | 1/2005 | Murade .................. G09G 5/006 345/99 |
| 2005/0057580 A1* | 3/2005 | Yamano ................. G09G 3/325 345/690 |
| 2005/0285988 A1* | 12/2005 | Nakagawa ........ G02F 1/136213 349/44 |
| 2007/0029940 A1* | 2/2007 | Tsuge ................... G09G 3/3283 315/169.3 |

FOREIGN PATENT DOCUMENTS

| CN | 107994060 A | 5/2018 |
| CN | 208256675 U | 12/2018 |
| CN | 110767157 A | 2/2020 |

* cited by examiner

*Primary Examiner* — Shaheda A Abdin
(74) *Attorney, Agent, or Firm* — Anova Law Group, PLLC

(57) ABSTRACT

An array substrate, a display panel and a display device are provided in the present disclosure. The array substrate includes a plurality of pixel circuits arranged in an array and a first signal line electrically connected to a pixel circuit of the plurality of pixel circuits. The first signal line includes a branch portion; the pixel circuit includes a storage capacitor, a drive transistor, and a first connection portion electrically connected to a gate electrode portion of the drive transistor; one plate of the storage capacitor at least partially overlaps the gate electrode portion of the drive transistor; and the branch portion at least partially overlaps the first connection portion.

17 Claims, 22 Drawing Sheets

10

10

US 11,373,599 B1

ARRAY SUBSTRATE, DISPLAY PANEL AND DISPLAY DEVICE

CROSS-REFERENCE TO RELATED APPLICATION

This application claims the priority of Chinese Patent Application No. 202110255288.7, filed on Mar. 9, 2021, the content of which is incorporated herein by reference in its entirety.

TECHNICAL FIELD

The present disclosure generally relates to the field of display technology and, more particularly, relates to an array substrate, a display panel and a display device.

BACKGROUND

Currently, the organic light-emitting diode (OLED) is one of the hot spots in the field of display research. Compared with liquid crystal displays (LCD), OLED displays have the advantages of low energy consumption, low production cost, self-luminescence, wide viewing angle, high response speed, and the like. OLED array substrates have begun to replace conventional LCD array substrates in the display fields of mobile phones, PDAs, digital cameras, and the like.

Pixel circuits, including drive transistors, are disposed in the OLED array substrates to drive OLED light-emitting elements. However, the gate potentials of the drive transistors are unstable which may affect the display effect.

SUMMARY

One aspect of the present disclosure provides an array substrate. The array substrate includes a plurality of pixel circuits arranged in an array; and a first signal line electrically connected to a pixel circuit of the plurality of pixel circuits, where the first signal line includes a branch portion; and the pixel circuit includes a storage capacitor, a drive transistor, and a first connection portion electrically connected to a gate electrode portion of the drive transistor. One plate of the storage capacitor at least partially overlaps the gate electrode portion of the drive transistor; and the branch portion at least partially overlaps the first connection portion.

Another aspect of the present disclosure provides a display panel, including an array substrate. The array substrate includes a plurality of pixel circuits arranged in an array; and a first signal line electrically connected to a pixel circuit of the plurality of pixel circuits, where the first signal line includes a branch portion; and the pixel circuit includes a storage capacitor, a drive transistor, and a first connection portion electrically connected to a gate electrode portion of the drive transistor. One plate of the storage capacitor at least partially overlaps the gate electrode portion of the drive transistor; and the branch portion at least partially overlaps the first connection portion.

Another aspect of the present disclosure provides a display device, including a display panel which includes an array substrate. The array substrate includes a plurality of pixel circuits arranged in an array; and a first signal line electrically connected to a pixel circuit of the plurality of pixel circuits, where the first signal line includes a branch portion; and the pixel circuit includes a storage capacitor, a drive transistor, and a first connection portion electrically connected to a gate electrode portion of the drive transistor. One plate of the storage capacitor at least partially overlaps the gate electrode portion of the drive transistor; and the branch portion at least partially overlaps the first connection portion.

Other aspects of the present disclosure can be understood by those skilled in the art in light of the description, the claims, and the drawings of the present disclosure.

BRIEF DESCRIPTION OF THE DRAWINGS

By reading the following detailed description of the non-limiting embodiments with reference to the accompanying drawings, other features, purposes and advantages of the present application may become more apparent, where same or similar reference signs may indicate same or similar features, and the accompanying drawings may not be drawn according to actual scales.

DETAILED DESCRIPTION

Figure 1:
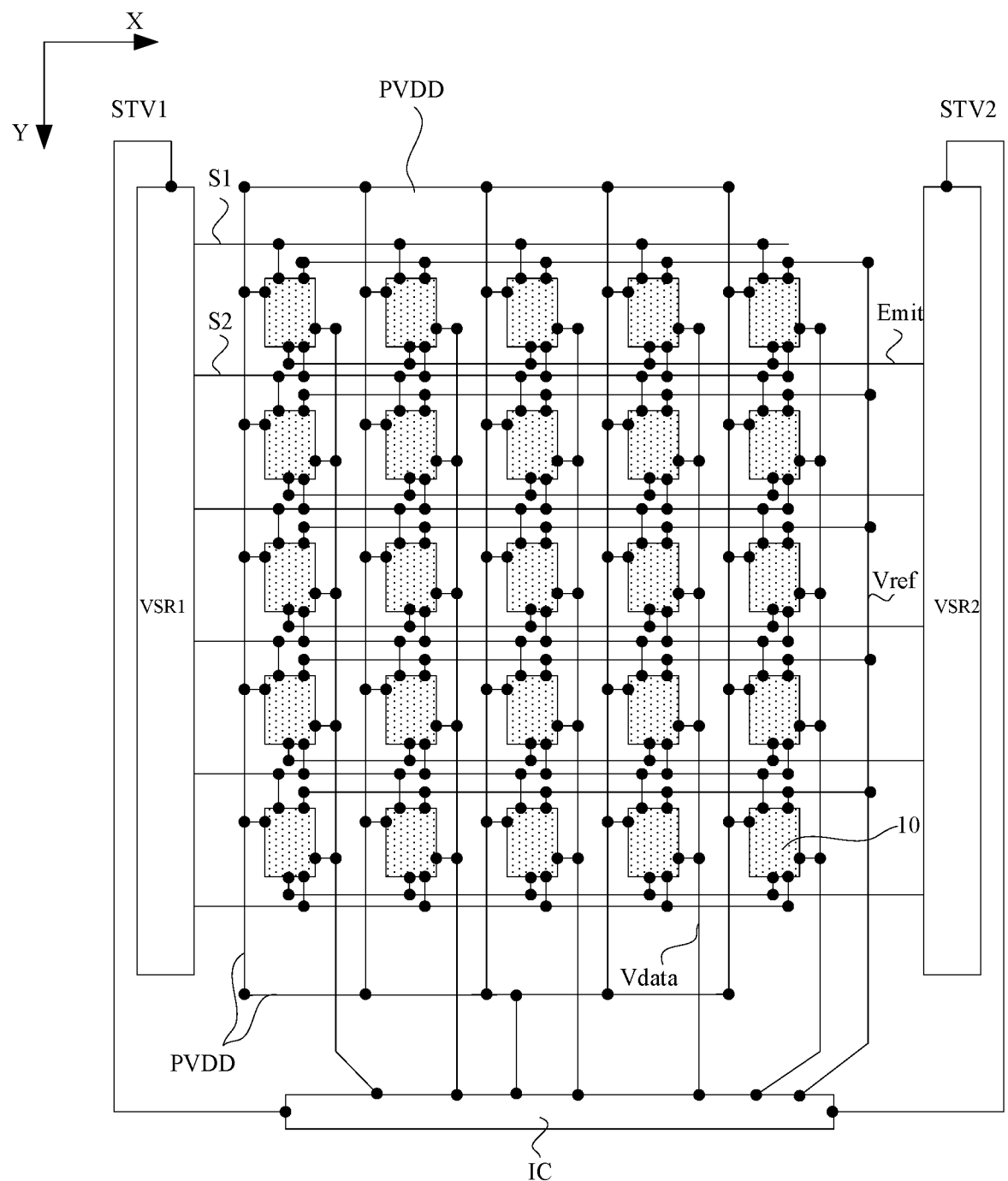
FIG. 1 illustrates a schematic top view of an array substrate according to various embodiments of the present disclosure.

Various features and exemplary embodiments of the present application are described in detail hereinafter. In order to clear illustrate the objectives, technical solutions, and advantages of the present application, the present application is further described in detail in conjunction with the drawings and exemplary embodiments. It should be understood that various embodiments described herein are only configured to explain the present application, and not configured to limit the present application. For those skilled in the art, the present application may be implemented without certain details. The following description of various embodiments is only to provide a better understanding of the present application by illustrating examples of the present application.

It should be noted that in the present application, relational terms, such as first, second and the like, may only be used to distinguish one entity or operation from another entity or operation, and may not necessarily require or imply any such actual relationship or order between such entities or operations.

It should be understood that for describing the structure of a component, when a layer or region is referred to as being "on" or "above" another layer or region, it may indicate that it is directly on another layer or region, or other layers or regions may be included between such layer or region and another layer or region. Furthermore, if the component is turned over, the layer or region may be "below" or "under" another layer or region.

An OLED array substrate may be disposed with pixel circuits to drive OLED light-emitting elements, the OLED light-emitting element may be driven by current, and the pixel circuit may include a drive transistor. However, the drift of the threshold voltage of the drive transistor may cause problems such as uneven display, so that a pixel compensation circuit may be used to compensate the drift of the threshold voltage of the drive transistor in the existing technology. However, the threshold voltage of the drive transistor may be compensated from the perspective of the equivalent circuit. In the actual layout design of the compensation circuit, relatively large parasitic capacitance and signal interference may exist between signal lines, transistors, and storage capacitors. The storage capacitor may maintain the gate electrode potential of the drive transistor within one frame; however, in the layout design, the storage capacitor may occupy a relatively large area, which is contrary to the trend of high pixel density (pixels per inch, PPI). In order to increase the area occupied by the storage capacitor, it may need to consider whether it may cause parasitic capacitance and signal interference. Therefore, the layout design of the storage capacitor is crucial, which has become a major technical challenge that may limit high PPI, high refresh rate, and the like.

Various embodiments of the present application provide an array substrate, a display panel, and a display device. Hereinafter, the array substrate, the display panel, and the display device provided by various embodiments of the present application are described with reference to the accompanying drawings.

As shown in FIG. 1, an array substrate 100 provided by various embodiments of the present application may include a plurality of pixel circuits 10. The plurality of pixel circuits 10 may be arranged in an array in a display region. For example, the plurality of pixel circuits 10 may be arranged in an array along a first direction X and a second direction Y which are intersected with each other.

Exemplarily, the array substrate 100 may further include a drive chip IC, a first gate electrode drive circuit VSR1, a second electrode gate electrode drive circuit VSR2, a power signal line PVDD, a data signal line Vdata, a reference signal line Vref, a first scan signal line S1, a second scan signal line S2, and a light-emitting control signal line Emit.

The first gate electrode drive circuit VSR1 may include a plurality of cascaded shift registers. The first gate electrode drive circuit VSR1 may be connected to the pixel circuit 10 through the first scan signal line S1 and the second scan signal line S2. The first gate electrode drive circuit VSR1 may be configured to provide a scan signal to the pixel circuit 10. The drive chip IC may provide a first start signal STV1 for the first gate electrode drive circuit VSR1. Furthermore, the second scan signal line S2 of a current row may be multiplexed as the first scan signal line S1 of a next row.

The second gate electrode drive circuit VSR2 may include a plurality of cascaded shift registers. The second gate electrode drive circuit VSR2 may be connected to the pixel circuit 10 through the light-emitting control signal line Emit. The second gate electrode drive circuit VSR2 may be configured to provide a light-emitting control signal to the pixel circuit 10. The drive chip IC may provide a second start signal STV2 for the second gate electrode drive circuit VSR2.

Furthermore, clock signal lines (not shown in FIG. 1) may be connected between the first gate electrode drive circuit VSR1 and the drive chip IC and between the second gate electrode drive circuit VSR2 and the drive chip IC. The drive chip IC may provide clock signals to the first gate electrode drive circuit VSR1 and the second gate electrode drive circuit VSR2.

Exemplarily, a gate electrode drive circuit capable of generating scan signals and light-emitting control signals simultaneously may also be provided, which may not be limited according to various embodiments of the present disclosure.

Figure 2:
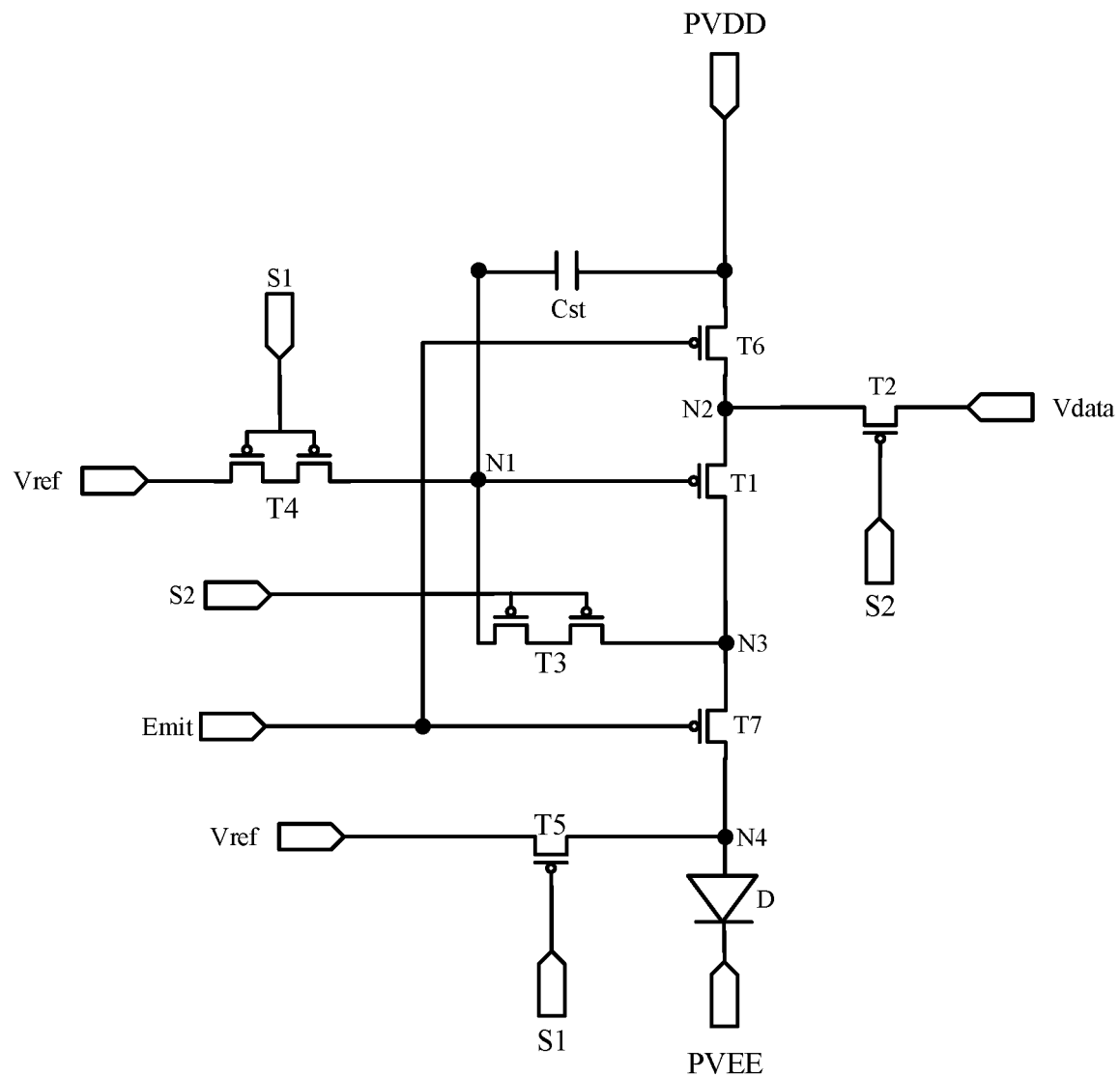
FIG. 2 illustrates a circuit structural diagram of a pixel circuit according to various embodiments of the present disclosure.

As shown in FIG. 2, the pixel circuit 10 may include a storage capacitor Cst and a drive transistor T1. Exemplarily, the pixel circuit 10 including the storage capacitor Cst and seven transistors may be taken as an example in FIG. 2, where T2 is a data write transistor, T3 is a compensation transistor, is a gate electrode initialization transistor, T5 is an anode initialization transistor, T6 is a power write transistor, T7 is a light-emitting control transistor, D is a light-emitting element, and PVEE is a common power signal line. The connection manners of all transistors and the signal lines may be shown in FIG. 2, which may not be described in detail herein, where N1, N2, N3, and N4 may represent connection nodes.

The power signal line PVDD may be configured to provide a power voltage to the drive transistor T1, and the voltage on the power signal line PVDD may be a positive voltage. The voltage on the common power signal line PVEE may be a negative voltage. The reference signal line Vref may be configured to provide a reset voltage signal, and the voltage on the reference signal line Vref may be a negative voltage.

Figure 3:
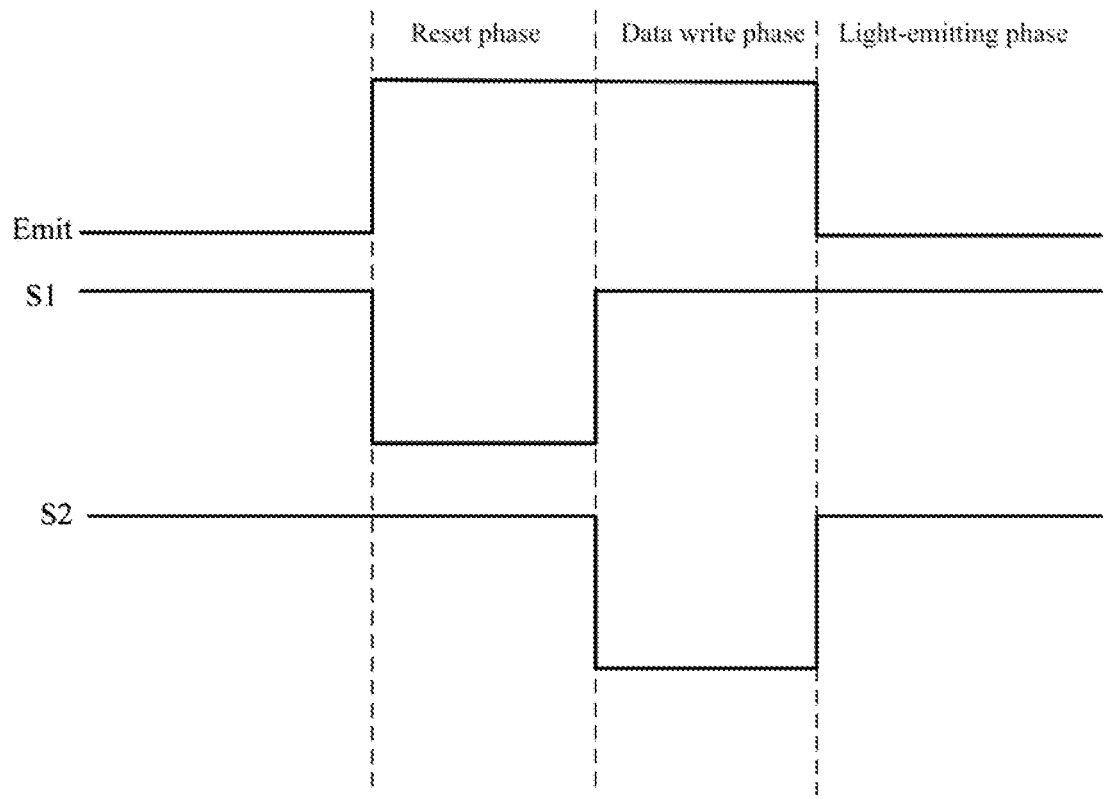
FIG. 3 illustrates a sequence diagram of FIG. 2.

Each transistor in the pixel circuit 10 as a P-type transistor may be taken as an example in FIG. 2. As shown in FIG. 3, the driving process of the pixel circuit 10 may include a reset phase, a data write phase, and a light-emitting phase. In the reset phase, the first scan signal line S1 may provide a low-level signal, the gate electrode initialization transistor T4 and the anode initialization transistor T5 may be in conduction, and the gate electrode potential of the drive transistor T1 and the anode potential of the light-emitting element may be reset. In the data write phase, the second scan signal line S2 may provide a low-level signal, the data write transistor T2 and the compensation transistor T3 may be in conduction, and the data signal on the data signal line Vdata may be written to the gate electrode of the drive transistor T1 to compensate the threshold voltage of the drive transistor T1. In the light-emitting phase, the light-emitting control signal line Emit may provide a low-level signal, the power write transistor T6 and the light-emitting control transistor T7 may be in conduction, the drive current generated by the drive transistor T1 may be transmitted to the light-emitting element, and the light-emitting element may emit light.

FIGS. 2-3 may be merely exemplary embodiments, which may not be used to limit the present application.

Figure 4:
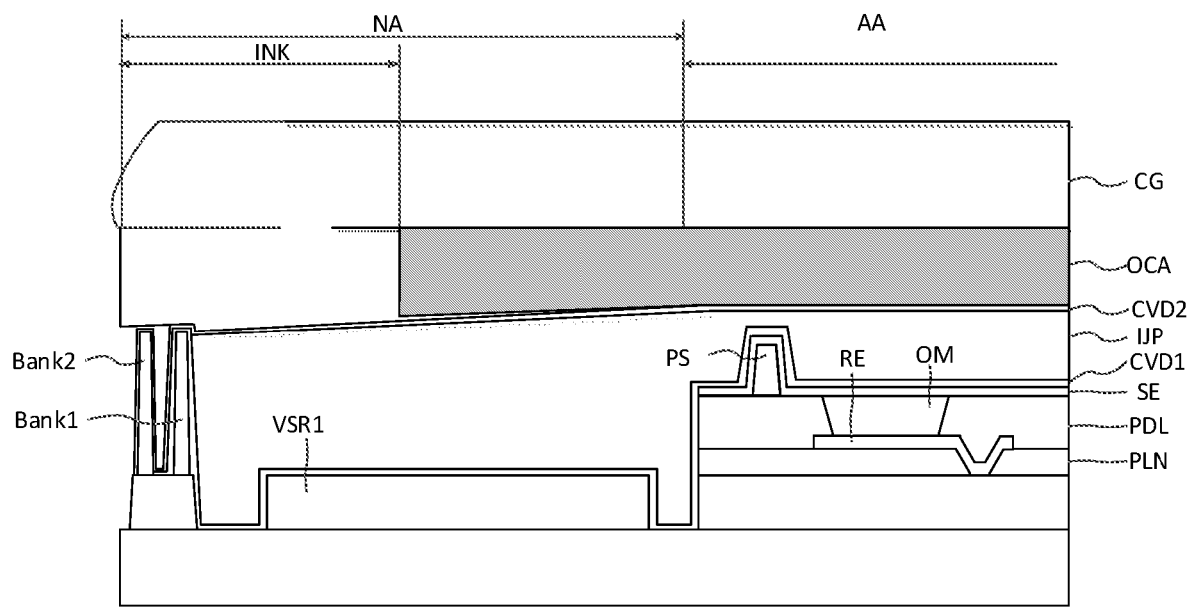
FIG. 4 illustrates a cross-sectional schematic of an array substrate according to various embodiments of the present disclosure.
Figure 5:
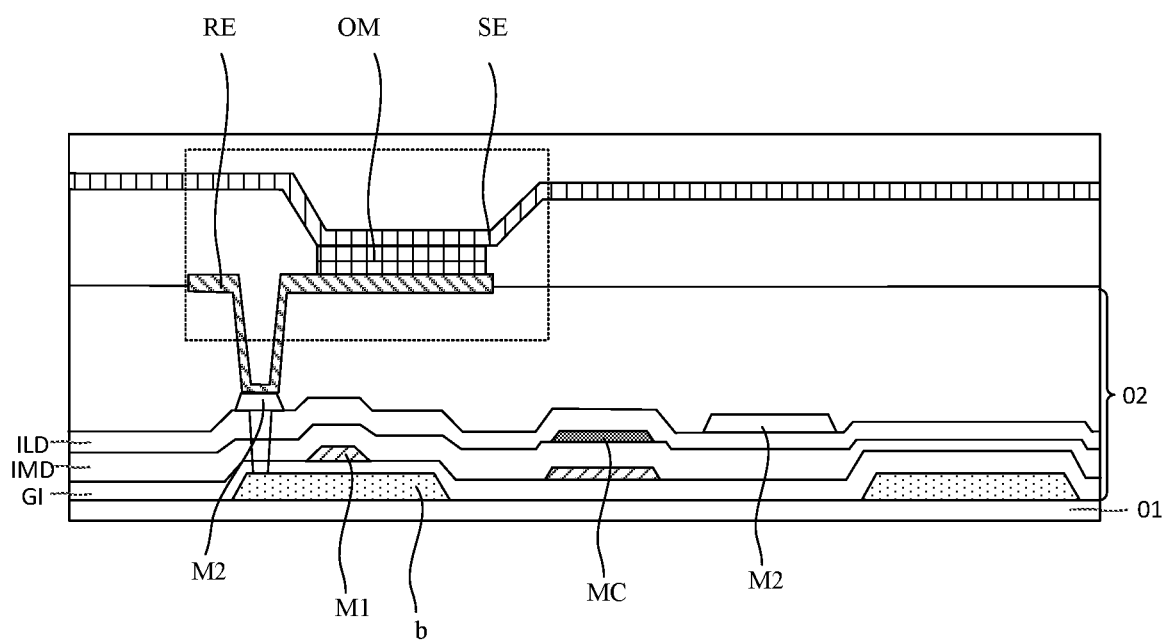
FIG. 5 illustrates another cross-sectional schematic of an array substrate according to various embodiments of the present disclosure.

In order to better understand the structure of the array substrate provided by various embodiment of the present disclosure as a whole, the structure of the array substrate may refer to FIGS. 4-5. As shown in FIG. 4, the array substrate may include a display region AA and a non-display region NA, and the non-display region NA may include an ink region INK. Exemplarily, the array substrate may include a substrate 01 and a device layer 02 disposed on a side of the substrate 01. FIG. 4 also illustrates a planarization layer PLN, a pixel definition layer PDL, a light-emitting element (including an anode RE, an organic light-emitting layer OM, and a cathode SE), a support column PS, a thin-film encapsulation layer (including a first inorganic layer CVD1, an organic layer UP, and a second inorganic layer CVD2), an optical adhesive layer OCA, and a cover plate CG. Furthermore, FIG. 4 also illustrates the first gate electrode drive circuit VSR1, a first retaining wall Bank1, and a second retaining wall Bank2. The first gate electrode drive circuit VSR1 may be disposed in the non-display region of the device layer 02.

The pixel circuit 10 may be disposed in the device layer 02, and the pixel circuit 10 may be connected to the anode RE of the light-emitting element. As shown in FIG. 5, the device layer 02 of the array substrate may include a gate electrode metal layer M1, a capacitor metal layer MC, and a source/drain metal layer M2 stacked along a direction away from the substrate 01. A semiconductor layer b may be disposed between the gate electrode metal layer M1 and the substrate 01. An insulation layer may be disposed between the metal layers and between the semiconductor layer b and the gate electrode metal layer M1. Exemplarily, a gate electrode insulation layer GI may be disposed between the gate electrode metal layer M1 and the semiconductor layer b; a capacitor insulation layer IMD may be disposed between the capacitor metal layer MC and the gate electrode metal layer M1; and an interlayer dielectric layer ILD may be disposed between the source/drain metal layer M2 and the capacitor metal layer MC.

The semiconductor layer b may be the semiconductor layer where the active layer of the transistor is located; the gate electrode metal layer M1 may be the metal conductive layer where the gate electrode of the transistor is located; the capacitor metal layer MC may be the conductive metal layer where one of the plates of the capacitor is located, and the source/drain metal layer M2 may be the conductive metal layer where the source electrode and the drain electrode of the transistor are located.

Exemplarily, the first scan signal line S1, the second scan signal line S2, and the light-emitting control signal line Emit may be disposed at the gate electrode metal layer M1. The reference signal line Vref may be disposed at the capacitor metal layer MC, and the power signal line PVDD and the data signal line Vdata may be disposed at the source/drain metal layer M2. Obviously, the film layer where each signal line is located may also be arranged in other manners, which may not be limited according to various embodiments in the present application.

Figure 6:
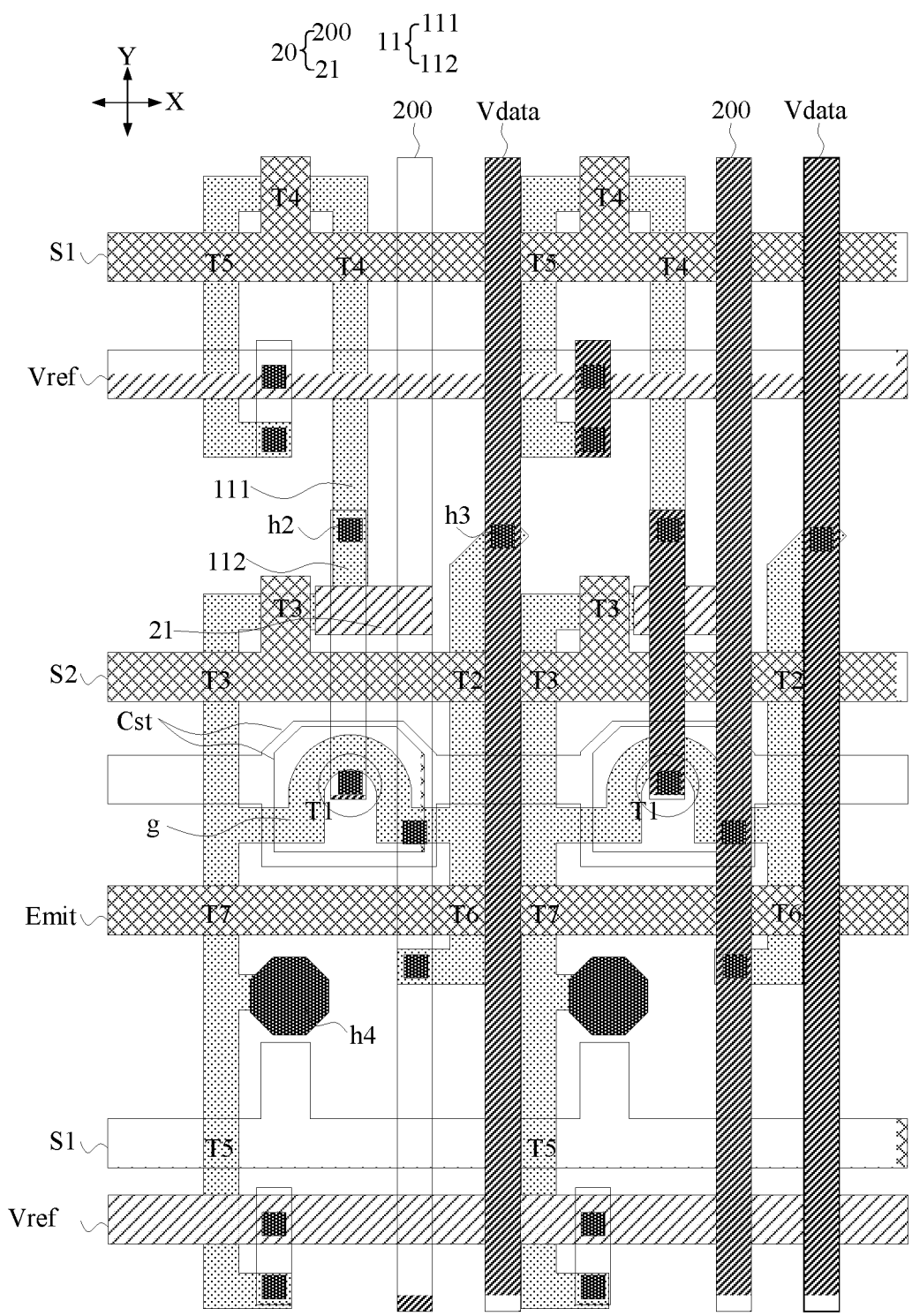
FIG. 6 illustrates a schematic top view of a local layout of an array substrate according to various embodiments of the present disclosure.
Figure 7:
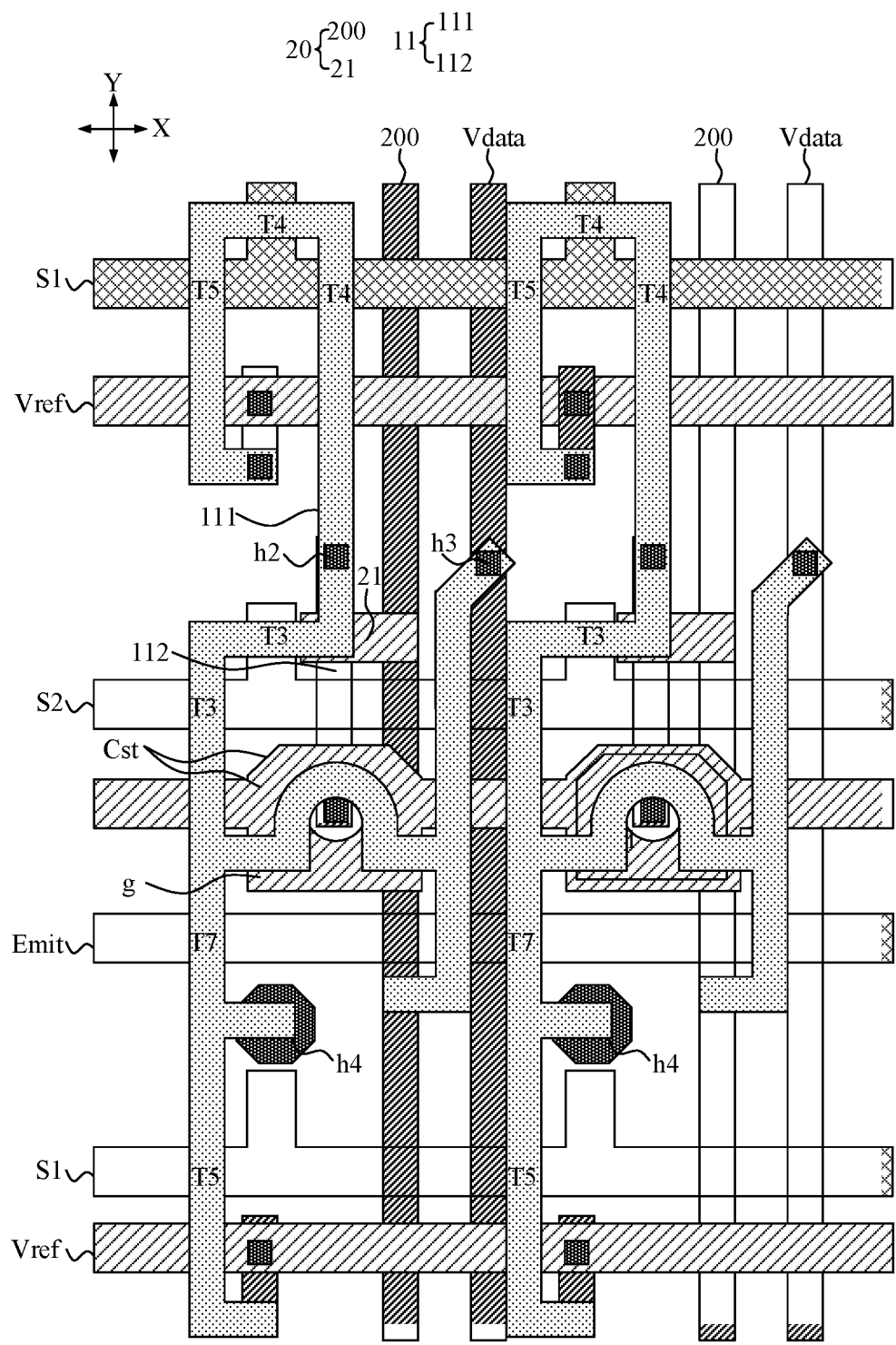
FIG. 7 illustrates another schematic top view of a local layout of an array substrate according to various embodiments of the present disclosure.

As shown in FIGS. 6 and 7, the array substrate 100 provided by various embodiments of the present application may further include a first signal line 20 electrically connected to each pixel circuit 10. In order to clearly illustrate the structure of the array substrate, FIGS. 6 and 7 are schematics from different angles, where FIG. 6 illustrates a schematic viewed from a front side (which can be understood as the source/drain metal layer M2 is on an upper layer), and FIG. 7 illustrates a schematic viewed from a back side (which can be understood as the semiconductor layer b is on an upper layer).

Furthermore, FIG. 6 only illustrates a local region of the array substrate 100, which may not be used to limit the present application.

Exemplarily, the first signal line 20 may be electrically connected to a fixed voltage terminal (not shown in the FIGS. 6-7), that is, the potential on the first signal line 20 may be a fixed potential.

In some optional embodiments of the present disclosure, the first signal line 20 may include the power signal line PVDD, the first signal line 20 may include a main body portion 200, and the main body portion 200 may be the power signal line PVDD. Exemplarily, the main body portion 200 of the first signal line 20 may extend along the second direction Y. Obviously, the first signal line 20 also may not include the main body portion, and an example in which the first signal line 20 does not include the main body portion may be described in the following embodiments.

Referring to FIGS. 6-7, the pixel circuit 10 may include the storage capacitor Cst, the drive transistor T1, and a first connection portion 11 electrically connected to the gate electrode portion g of the drive transistor T1. One plate of the storage capacitor Cst may at least partially overlap the gate electrode portion g of the drive transistor T1. That is, the storage capacitor Cst may be electrically connected to the gate electrode portion g of the drive transistor T1, and the gate electrode portion g of the drive transistor T1 may be at least partially multiplexed as a plate of the storage capacitor Cst.

Furthermore, the gate electrode portion g of the drive transistor T1 and the first connection portion 11 may be disposed at different film layers. For example, the first connection portion 11 may be at least partially located in the source/drain metal layer M2; and the first connection portion 11 may be connected to the gate electrode portion g of the drive transistor T1 through a via. In order to avoid signal crosstalk, the plate of the storage capacitor Cst disposed at the capacitor metal layer MC may include a through hole, the via connecting the gate electrode portion g of the drive transistor T1 to the first connection portion 11 may pass through the through hole on the plate of the storage capacitor Cst.

The first signal line 20 may include a branch portion 21. It can be understood that the potential on the branch portion 21 may be same as the potential on the first signal line 20. Exemplarily, in the case where the first signal line 20 includes the main body portion, the branch portion 21 may be electrically connected to the main body portion 200 of the first signal line 20.

The branch portion 21 may at least partially overlap the first connection portion 11. That is, the branch portion 21 and the first connection portion 11 may be located at different film layers, and the orthographic projection of the branch portion 21 on the plane where the array substrate 100 is located may at least partially overlap the orthographic projection of the first connection portion 11 on the plane where the array substrate 100 is located.

Exemplarily, the first signal line 20 as the power signal line PVDD may be taken as an example for description. Referring to FIG. 6 or FIG. 7, the storage capacitor Cst may be designed in the region surrounded by the semiconductor layer including the compensation transistor T3 and the light-emitting control transistor T7, the semiconductor layer including the data write transistor T2 and the power write transistor T6, the second scan signal line S2 and the light-emitting control signal line Emit. If the area of the storage capacitor Cst is directly increased, the width of Cst may need to be increased along the first direction X or the second direction Y; and if the parasitic capacitance is kept unchanged basically, the above-mentioned scan signal line or a semiconductor part surrounding Cst may need to be expanded along the first direction X or the second direction Y synchronously, thereby maintaining the pitch between the scan signal line or the semiconductor portion and Cst to be unchanged. In such way, the pitch along the first direction X or the second direction Y of the layout of the pixel circuits may be increased, resulting in PPI decrease. If only the area of the Cst is increased and the above-mentioned scan signal line and semiconductor layer do not move to maintain the pitch to be unchanged, the pitch between the Cst and each of such scan signal line and the semiconductor layer may be reduced. The pitch may be already at a relatively small dimension, and the pitch reduction may cause the interference of the parasitic capacitance to increase sharply; and during the formation process, a relatively small pitch may cause a short circuit between the signal lines at a same film layer, which may reduce the production yield.

However, in one embodiment, the first connection portion 11 electrically connected to the gate electrode portion g of the drive transistor T1 directly may be used as a part to increase the "storage capacitor", the branch portion 21 may be electrically connected to the main body portion 200 of the first signal line 20, and the overlapped portion of the branch portion 21 and the first connection portion 11 may form an auxiliary storage capacitor. As such, the concept of the disclosed storage capacitor can be extended over conventional storage capacitor. On the one hand, when the data signal is written into the storage capacitor, the data signal, via the data signal line Vdata, may first reach the first connection portion 11 through the drive transistor T1 and the compensation transistor T3, and may be transmitted to the storage capacitor Cst connected to the gate electrode of the drive transistor from the first connection portion 11, thereby charging the storage capacitor and also charging the auxiliary storage capacitor formed by the branch portion 21 and the first connection portion 11. Therefore, the capacitance of the capacitor electrically connected to the gate electrode portion g of the drive transistor T1 in the pixel circuit 10 may be increased, the stability of the gate potential of the drive transistor T1 (that is, the potential of the N node in FIG. 2) may be improved, and the crosstalk influence on the gate potential of the drive transistor T1 may be reduced, thereby reducing the crosstalk problem.

On the other hand, the capacitance of the auxiliary storage capacitor formed by the branch portion 21 and the first connection portion 11 may be relatively small, and the charging time constant of the capacitor may be $t_c$=RC. The auxiliary storage capacitor may include the first connection portion 11 and the branch portion 21; and when the data signal is written into the storage capacitor, the data signal, via the data line number line Vdata, may first reach the first connection portion 11 through the drive transistor T1 and the compensation transistor T3. That is, the auxiliary storage capacitor may be closer to the charging power source, and the R of the auxiliary storage capacitor may be relatively smaller. Therefore, compared to the case where the storage capacitor Cst is increased by a same capacitance value C, the auxiliary storage capacitor R may be smaller, such that the charging speed may be faster, which may further reduce the technical problem of high-frequency driving.

Furthermore, under high-frequency driving, since the time of one frame is greatly shortened, the charging time of each row may also be further reduced, resulting in charging time reduction, and only the capacitance value of the storage capacitor Cst may be reduced to accelerate the charging speed. However, due to that the hopping rate of data signals, scan signals, and clock signals are greatly increased in high-frequency driving, signal coupling and crosstalk problems may be aggravated, and the capacitance value of the storage capacitor may need to be increased to stabilize the potential of the N1 node. Therefore, such contradiction may result in that the display effect under high-frequency driving may be greatly compromised. However, the auxiliary storage capacitor may be added in the present application, which is equivalent to dividing one storage capacitor in the existing technology into two parts. In such way, the capacitance of the storage capacitor may be reduced, and the charging time may be reduced, thereby reducing the contradiction of high-frequency drive storage capacitor.

In other optional embodiments, the first signal line 20 may be the reference signal line Vref, and the reference signal line Vref may be used to provide a reset voltage signal. For example, the first signal line 20 may be configured to provide a reset voltage signal to the gate electrode of the drive transistor in the pixel circuit 10, and may also be configured to provide a reset voltage signal to the anode of the light-emitting element. The reset voltage signal provided by the first signal line 20 may be a negative voltage.

When the displayed data voltage is a black state voltage, the potential of the N1 node may be close to the potential of the power signal line PVDD, so that the voltage difference between two terminals of the storage capacitor Cst may be relatively small, that is, U in Q=C*U may be relatively small, and the capacitance value C of the storage capacitor Cst may be fixed. Therefore, the charge quantity Q=C*U of the storage capacitor Cst may be relatively small when the data voltage is the black state voltage. In various embodiments of the present application, when the first signal line 20 is the reference signal line Vref, the potential of the branch portion 21 of the auxiliary capacitor formed by the branch portion 21 and the first connection portion 11 may be same as the potential of the reference signal line Vref, and the difference between the potential of the reference signal line Vref and the potential of the power supply signal line PVDD may be relatively large, which may cause the N1 node to store more charges when the black state voltage is applied.

Exemplarily, the input terminal of the gate electrode initialization transistor T4 in the pixel circuit 10 of a current row may be electrically connected to the node N4 of the pixel circuit of a previous row. Exemplarily, a fourth via h4 may be configured to connect the anodes of the light-emitting elements D, and the anode of the light-emitting element D in a current row may be electrically connected to the anode initialization transistor T5 (T5 located at a lower portion in FIG. 6) connected to the first scan signal line S1 in a next row. Exemplarily, the second scan signal line S2 of a current row may be electrically connected to the first scan signal line S1 of a next row, that is, the scan signal on the second scan signal line S2 of the current row may be same as the scan signal on the first scan signal line S1 of the next row. Only some examples may be described above, which may not be used to limit the present application.

Furthermore, the structure of the pixel circuit provided in various embodiments of the present application may only be an example. On the basis that the pixel circuit 10 includes the storage capacitor Cst, the drive transistor T1, and the branch portion 21 at least partially overlaps the first connection portion 11, the circuit structure of the pixel circuit 10 and the layout structure of the array substrate may not be limited according to various embodiments of the present disclosure.

It can be understood that when the first signal line 20 is the power signal line PVDD, the auxiliary storage capacitor formed by the overlapped portion of the branch portion 21 and the first connection portion 11 may be in parallel with the storage capacitor Cst. When the first signal line 20 is the reference signal line Vref, the auxiliary storage capacitor formed by the overlapped portion of the branch portion 21 and the first connection portion 11 may be not in parallel with the storage capacitor Cst.

Figure 8:
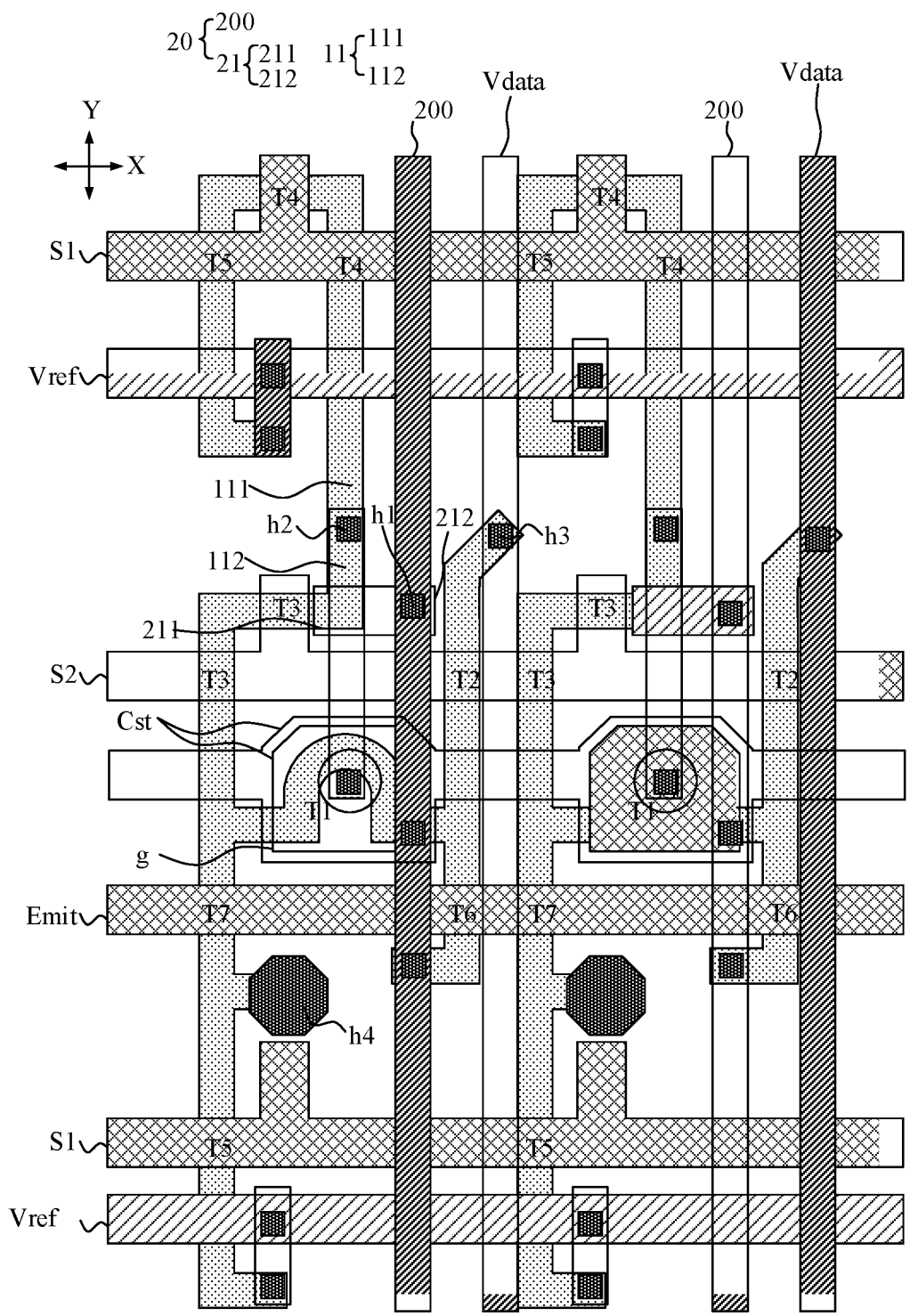
FIGS. 8-18 illustrate schematic top views of local layouts of array substrates according to various embodiments of the present disclosure.

In some optional embodiments, as shown in FIG. 8, the branch portion 21 may include a connection branch portion 212 and a first branch portion 211. The connection branch portion 212 may be electrically connected to the first signal line 20 through a first via h1. It can be understood that the first signal line 20 may further include the main body portion 200, and the connection branch portion 212 may be connected to the main body portion 200 of the first signal line 20. The first branch portion 211 may at least partially overlap the first connection portion 11. It can be understood that the connection branch portion 212 and the main body portion 200 of the first signal line 20 may be located at different film layers. Exemplarily, the first branch portion 211 and the connection branch portion 212 may be located at a same film layer.

In various embodiments of the present application, the first branch portion 211 and the first signal line 20 may be connected through the connection branch portion 212, and the overlapped portion of the first branch portion 211 and the first connection portion 11 may form the auxiliary storage capacitor.

Exemplarily, if the first via h1 is disposed on the side of the second scan signal line S2 adjacent to the drive transistor T1, in order to prevent the second scan signal line S2 from being overlapped with the first via h1, it is necessary to move the second scan signal line S2 toward the side away from the drive transistor T1 along the second direction Y, which may increase the pitch along the second direction Y and decrease the PPI. In addition, two plates of the storage capacitor Cst may be respectively located on the gate electrode metal layer and the capacitor metal layer, and a a-shaped or n-shaped semiconductor may be below the storage capacitor Cst, so that it is necessary to increase the pitch when the first branch portion 211 is disposed at any one of the film layers, which may greatly increase the layout design difficulty and decrease the PPI. Therefore, the first via h1 may be disposed on the side of the second scan signal line S2 away from the drive transistor T1, which may avoid the PPI reduction and may not increase the difficulty of forming the first via h1. Furthermore, taking the case that the first connection portion 11 includes a first semiconductor connection portion 111 and a first metal connection portion 112, and the data signal line Vdata and the data write transistor T2 are connected with each other through a third via h3 as an example, the first via h1 may be disposed on the side of the second scan signal line S2 away from the drive transistor T1, and a vertical isolation column, which is perpendicular to the plane where the array substrate is located, may be formed between the first metal connection portion 112 and the third via h3, thereby isolating the signal coupling between the first metal connection portion 112 and the third via h3.

Obviously, the first via h1 may also be disposed in other positions, which may not be limited according to various embodiments of the present disclosure.

Exemplarily, when the connection branch portion 212 and the main body portion 200 of the first signal line 20 are located at a same film layer, the connection branch portion 212 and the main body portion 200 of the first signal line 20 may be directly connected, and the first via h1 may not need to be disposed.

In some optional embodiments, as shown in FIG. 6 or FIG. 7, the pixel circuit 10 may include the gate electrode initialization transistor T4. The gate electrode initialization transistor T4 may be electrically connected to the gate electrode portion g of the drive transistor T1 through the first connection portion 11. The first connection portion 11 may include the first semiconductor connection portion 111 and the first metal connection portion 112. The first semiconductor connection portion 111 and the first metal connection portion 112 may be located at different film layers; the first semiconductor connection portion 111 and the first metal connection portion 112 may be connected with each other through the second via h2; and the second via h2 may be located on the side of the first branch portion 211 away from the drive transistor T1.

The first semiconductor connection portion 111 may be connected to the semiconductor portion of the compensation transistor T3. By disposing the second via h2 on the side of the first branch portion 211 away from the drive transistor T1, the first branch portion 211 may overlap each of the first metal connection portion 112 and the first semiconductor connection portion 111, the first branch portion 211 and the first metal connection portion 112 may form the auxiliary storage capacitor, and the first branch portion 211 and the first semiconductor connection portion 111 may also form the auxiliary storage capacitor, which may further increase the capacitance of the auxiliary storage capacitor.

Exemplarily, the first branch portion 211 may be located between the first metal connection portion 112 and the first semiconductor connection portion 111, such that the plate spacing of the auxiliary storage capacitor formed by the first branch portion 211 and the first metal connection portion 112 and the plate spacing of the auxiliary storage capacitor formed by the first branch portion 211 and the first semiconductor connection portion 111 may be relatively small, which may further increase the capacitance of the auxiliary storage capacitor.

Exemplarily, the first semiconductor connection portion 111 may be located at the semiconductor layer b, the first metal connection portion 112 may be located at the source/drain metal layer M2, and the first branch portion 211 may be located at the capacitor metal layer MC. The gate insulation layer GI and the capacitor insulation layer IMD may be spaced between the first branch portion 211 and the first semiconductor connection portion 111; and the interlayer dielectric layer ILD may be spaced between the first branch portion 211 and the first metal connection portion 112. Therefore, the plate spacing of the auxiliary storage capacitor formed by the first branch portion 211 and the first metal connection portion 112 and the plate spacing of the auxiliary storage capacitor formed by the first branch portion 211 and the first semiconductor connection portion 111 may be relatively small, which may further increase the capacitance of the auxiliary storage capacitor.

Furthermore, the first branch portion 211 is disposed at the capacitor metal layer MC instead of the gate electrode metal layer M1, such that the pitch between the first branch portion 211 and an adjacent second scan signal line S2 may be smaller. For example, the first branch portion 211 and the adjacent second scan signal line S2 may both be disposed at the gate electrode metal layer M1, and the pitch between the first branch portion 211 and the adjacent second scan signal line S2 may need to be at least 2 μm, which may lead to the need of the pitch increase and the PPI reduction. However, the first branch portion 211 is disposed at the capacitor metal layer MC, and the second scan signal line S2 is disposed at the gate electrode metal layer M1; and the pitch between the first branch portion 211 and the adjacent second scan signal line S2 may be about 1 μm, which may avoid the pitch increase and the PPI reduction.

Exemplarily, the semiconductor portion of the gate electrode initialization transistor T4 and the first semiconductor connection portion 111 may be located at a same film layer and directly connected with each other; and the gate electrode portion g of the drive transistor T1 and the first metal connection portion 112 may be located at different film layers and connected with each other through a via.

Exemplarily, the gate electrode initialization transistor T4 may be a double gate transistor, thereby further improving the stability of the gate potential of the drive transistor T1.

Figure 9:
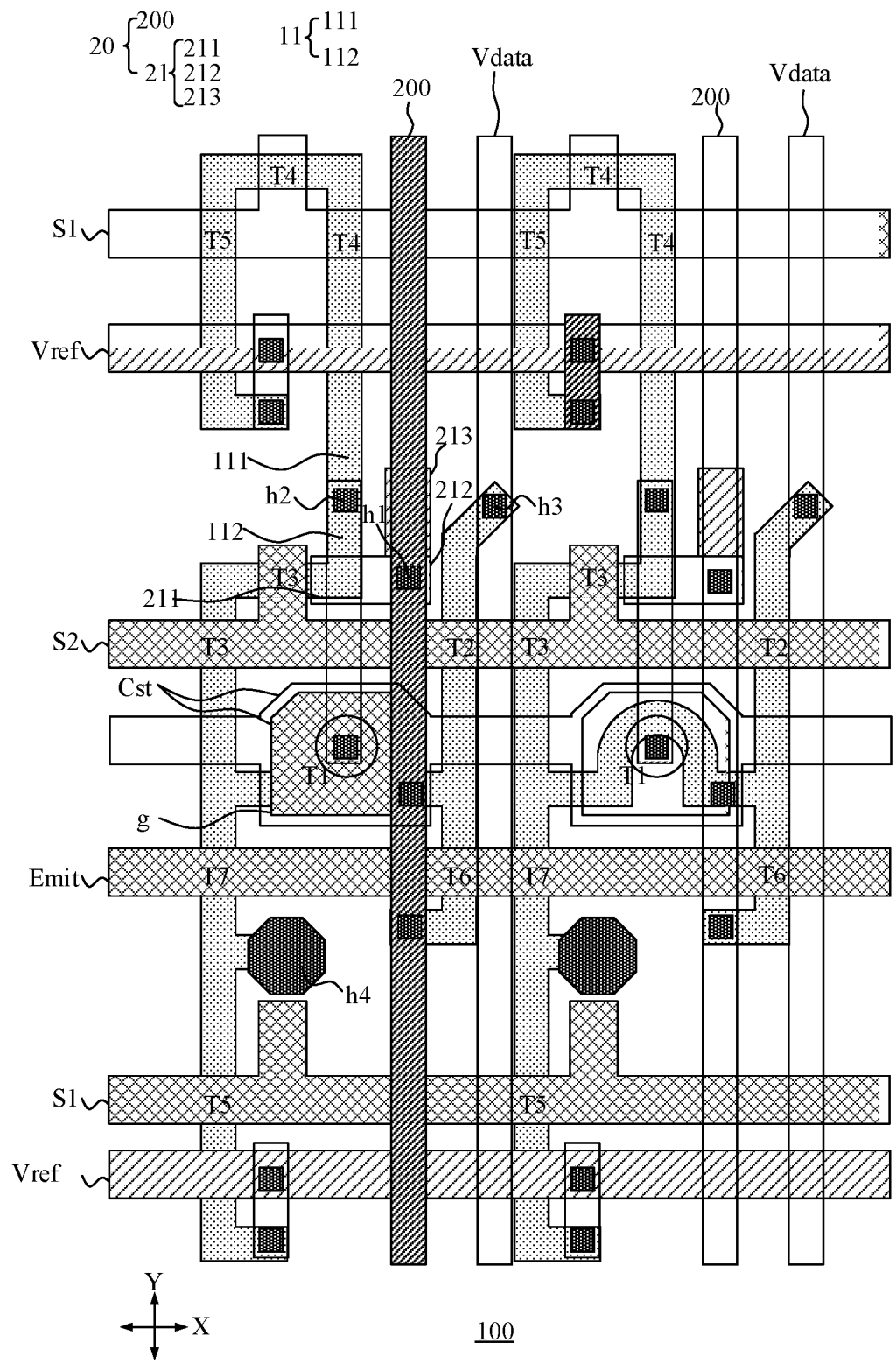
Figure 10:
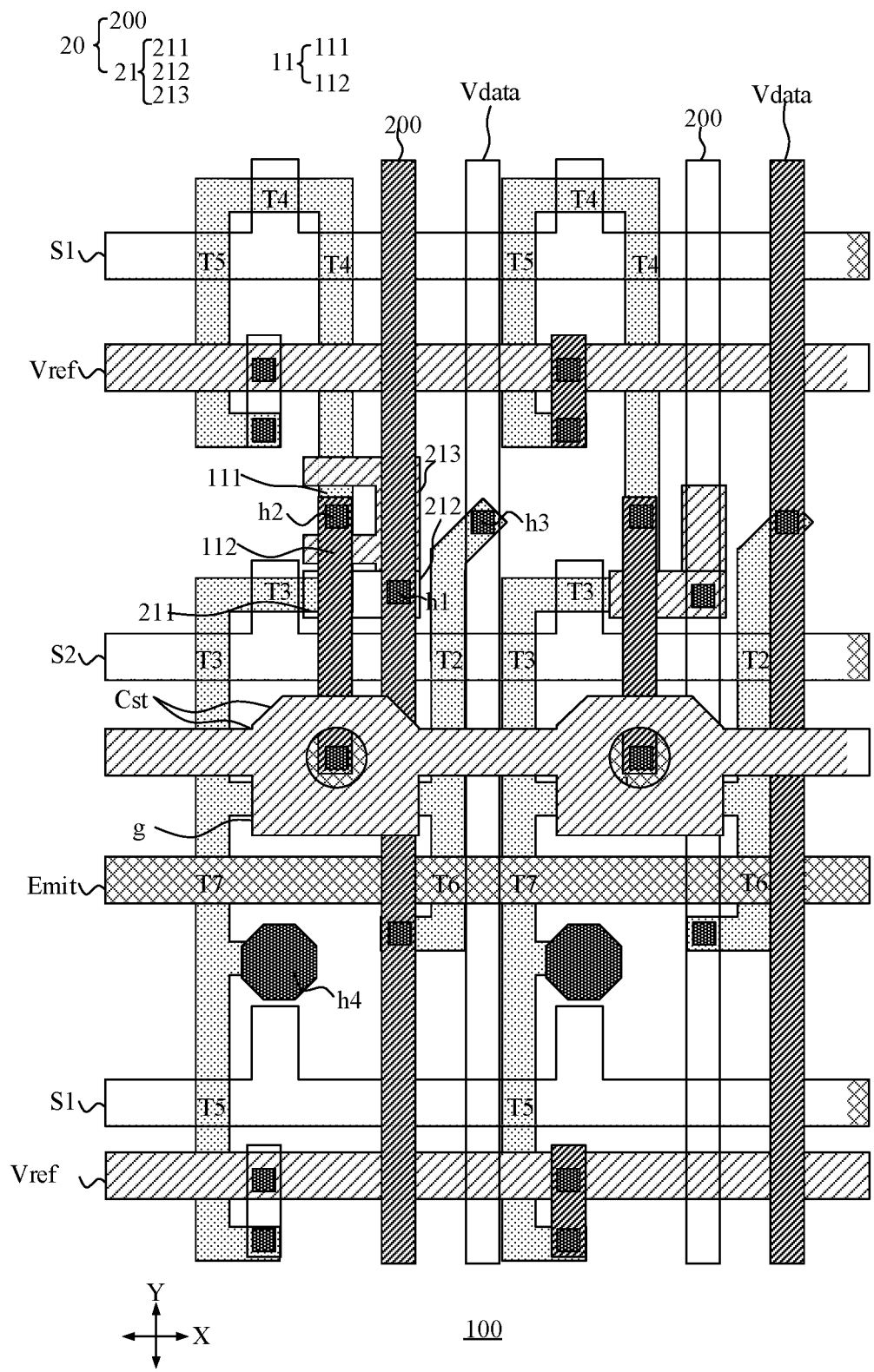

In some optional embodiments, as shown in FIG. 9 or FIG. 10, the pixel circuit 10 may include the gate electrode initialization transistor T4 and the data write transistor T2. The gate electrode initialization transistor T4 may be electrically connected to the gate electrode portion g of the drive transistor T1 through the first connection portion 11; the first connection portion 11 may include the first semiconductor connection portion 111 and the first metal connection portion 112; the first semiconductor connection portion 111 and the first metal connection portion 112 may be connected with each other through the second via h2; and the data write transistor T2 may be connected to the data signal line Vdata through the third via h3.

The branch portion 21 may further include a second branch portion 213, and the orthographic projection of the second branch portion 213 on the plane where the array substrate 100 is located may be between the orthographic projections of the second via h2 and the third via h3 on the plane where the array substrate is located. It can be understood that the potential on the second branch portion 213 and the potential on the first signal line 20, which are both fixed potentials, may be same; and the second branch portion 213 may be located between the second via h2 and the third via h3, such that the second branch portion 213 may form an isolation structure along the second direction Y between the second via h2 and the third via h3, which may isolate the signal coupling between the second via h2 and the third via h3.

Exemplarily, the second branch portion 213 may be connected to the main body portion 200 of the first signal line 20 through the connection branch portion 212. The second branch portion 213 may be located at the side of the connection branch portion 212 away from the drive transistor T1. The extension direction of the second branch portion 213 may be same as the extension direction of the main body portion 200 of the first signal line 20.

Exemplarily, the first branch portion 211, the connection branch portion 212, and the second branch portion 213 may be located at a same film layer.

Exemplarily, as shown in FIG. 10, the second branch portion 213 may overlap at least one of the first semiconductor connection portion 111 and the first metal connection portion 112; and the second branch portion 213 may not overlap the second via h2. The overlapped portion of the second branch portion 213 and the first semiconductor connection portion 111 and/or the first metal connection portion 112 may also form the auxiliary storage capacitor of the pixel circuit 10, which may further increase the capacity of the capacitor electrically connected to the gate electrode portion g of the drive transistor T1 in the pixel circuit 10 and improve the stability of the gate potential of the drive transistor T1.

It can be understood that the auxiliary storage capacitor formed by the overlapped portion of the first branch portion 211 and the first connection portion 11 may be in parallel with the auxiliary storage capacitor formed by the overlapped portion of the second branch portion 213 and the first semiconductor connection portion 111 and/or the first metal connection portion 112. In addition, since the second branch portion 213 does not overlap the second via h2, the wire widths at different positions of the second branch portion 213 may be different.

Figure 11:
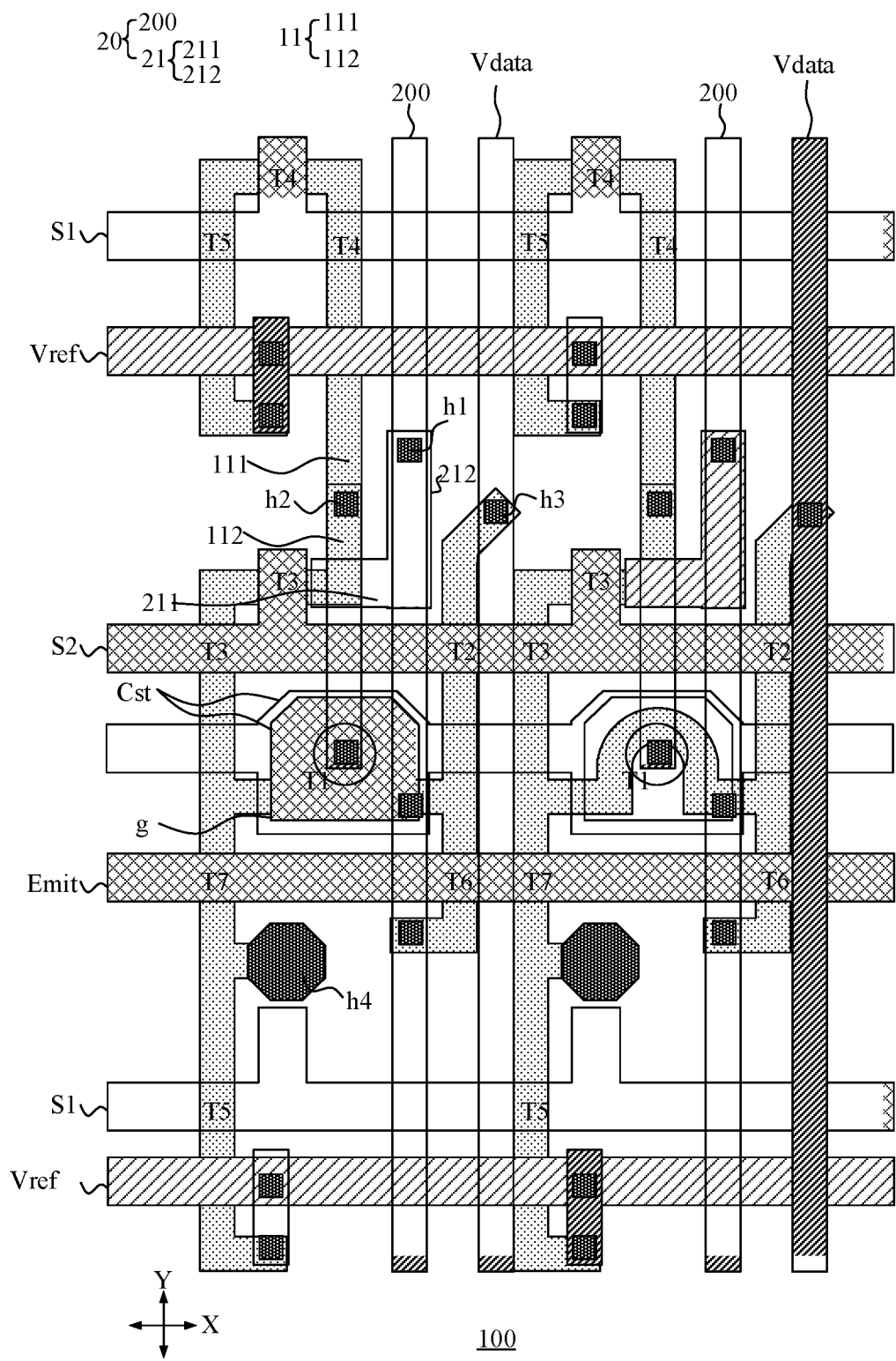

In some optional embodiments, as shown in FIG. 11, the pixel circuit 10 including the gate electrode initialization transistor T4 and the data write transistor T2 may still be taken as an example. The structures and connection manners of the gate electrode initialization transistor T4, the data write transistor T2, the first connection portion 11, the data signal line Vdata, and each via may be same as those in the above-mentioned embodiments of the present disclosure. The difference may be that the orthographic projection of the connection branch 212 on the plane where the array substrate is located may be located between the orthographic projections of the second via h2 and the third via h3 on the plane where the array substrate is located; and the first via h1 may be located on the side of the second via h2 away from the drive transistor T1. In such way, the connection branch portion 212 may be multiplexed as an isolation structure between the second via h2 and the third via h3 to isolate the signal coupling between the second via h2 and the third via h3; and the additional second branch portion 213 as shown in FIG. 9 or FIG. 10 may not need to be disposed.

That is, the extension length of the connection branch portion 212 shown in FIG. 11 along the direction away from the drive transistor T1 may be greater than the extension length of the connection branch portion 212 shown in FIG. 9 or FIG. 10 along the direction away from the drive transistor T1.

Figure 12:
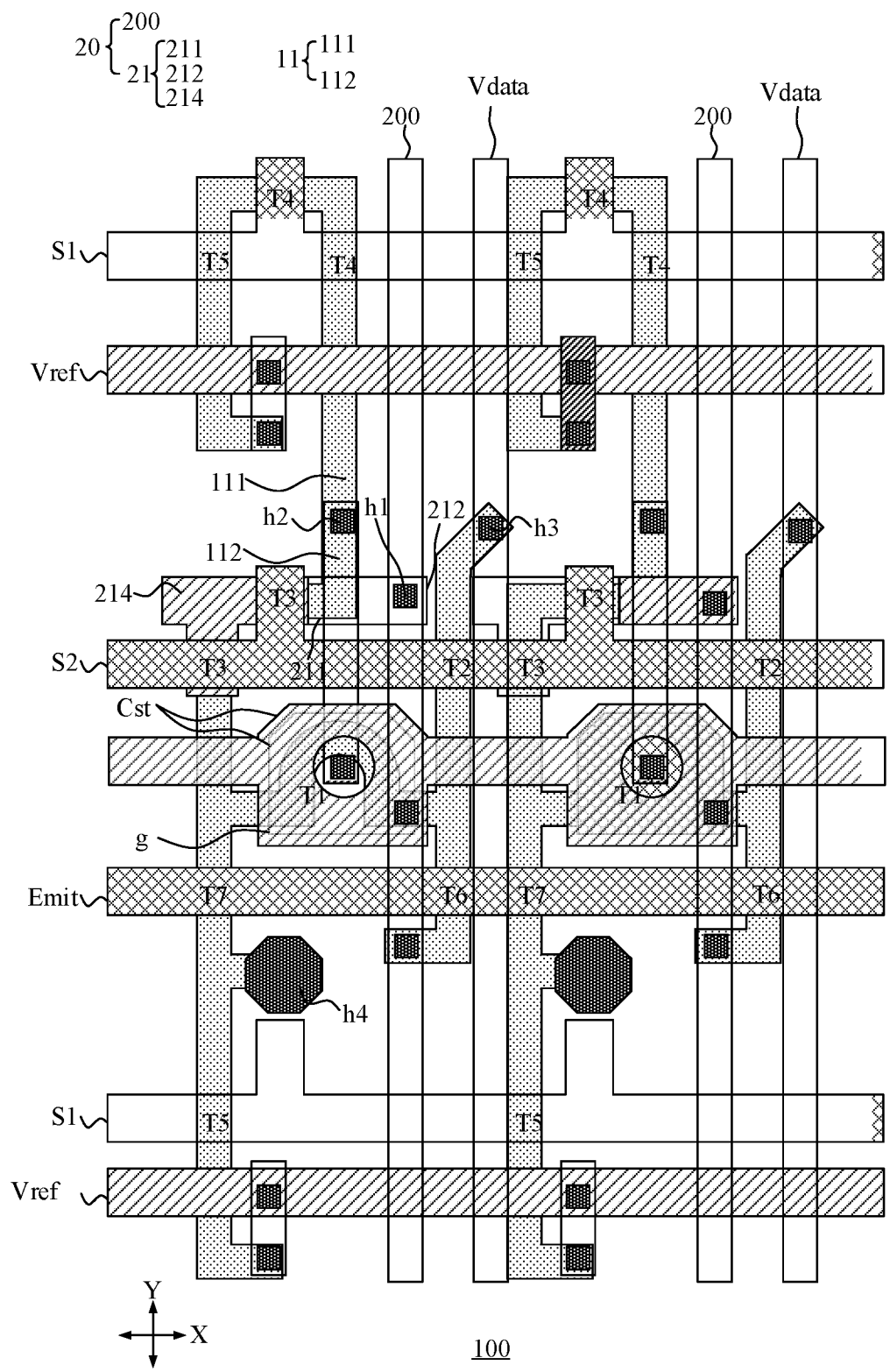
Figure 13:
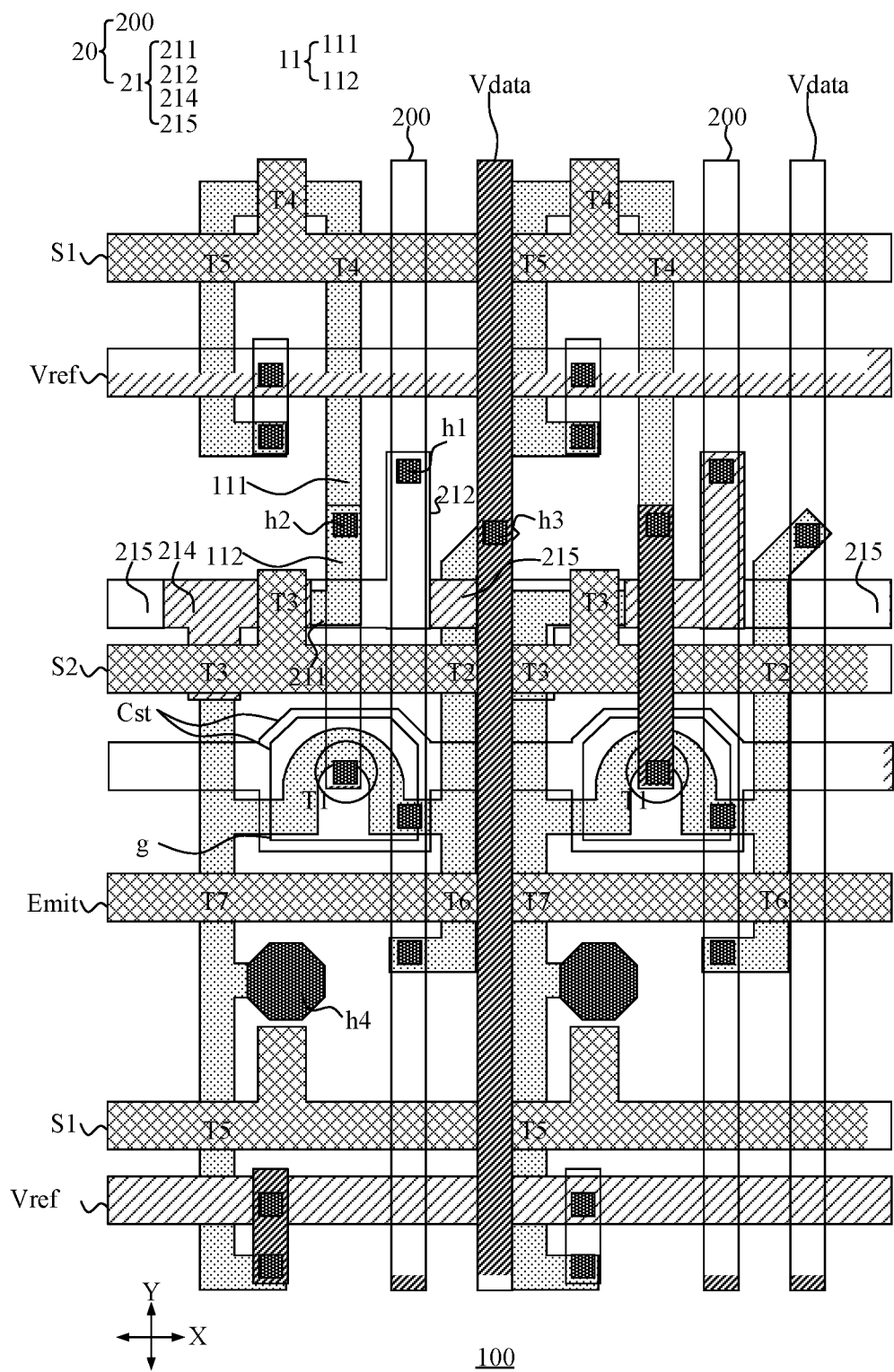

In some optional embodiments, as shown in FIG. 12 or FIG. 13, the branch portion 21 may further include a first blocking portion 214, and the pixel circuit 10 may include the compensation transistor T3. The compensation transistor T3 may be connected between the gate electrode of the drive transistor T1 and the second electrode of the drive transistor T1. The compensation transistor T3 may be configured to compensate the threshold voltage of the drive transistor T1. Exemplarily, the overlapped region of the semiconductor portion of the compensation transistor T3 and the second scan signal line S2 may be the channel of the compensation transistor T3. After the channel of the compensation transistor T3 is irradiated by light, the leakage current of the compensation transistor T3 may increase, which may result in that the gate potential of the drive transistor T1 is unstable to cause problems such as screen shaking. In various embodiments of the present application, the first blocking portion 214 and the channel of the compensation transistor T3 may be at least partially overlapped with each other. The first blocking portion 214 may be used to block light from irradiating to the channel of the compensation transistor T3, reduce the leakage current of the compensation transistor T3, and further improve the stability of the gate potential of the drive transistor T1, thereby improving the display effect.

Exemplarily, the compensation transistor T3 may also be a double gate transistor, thereby further improving the stability of the gate potential of the drive transistor T1.

Furthermore, when the compensation transistor T3 is a double gate transistor, the compensation transistor T3 may have two channels, and the first shielding portion 214 may at least partially overlap both of two channels of the compensation transistor T3.

Exemplarily, the first branch portion 211, the connection branch portion 212, and the first shielding portion 214 may be located at a same film layer.

In some optional embodiments, as shown in FIG. 13, the branch portion 21 may further include a connection portion 215, and the connection portion 215 may connect adjacent branch portions 21 corresponding to the pixel circuits 10 in a same row. Exemplarily, the connection portion 215 may connect adjacent first connection portions 21 corresponding to the pixel circuits 10 in a same row. Taking the main body portion 200 of the first signal line 20 extending along the second direction Y as an example, the branch portion 21 may extend along the first direction X as a whole, and a plurality of main body portions 200 and a plurality of branch portions 21 may form grid-shaped first signal lines 20, which may reduce the voltage drop of the first signal lines 20.

In some optional embodiments, as shown in FIG. 13, the pixel circuit 10 may include the data write transistor T2; the data write transistor T2 may be connected to the data signal line Vdata through the third via h3; and the third via h3 may be located on the side of the connection portion 215 away from the drive transistor T1. The connection portion 215 may form an isolation structure between the third via h3 and the compensation transistor T3, and the connection portion 215 may isolate the signal coupling between the third via h3 and the compensation transistor T3 to avoid crosstalk.

Similarly, if the third via h3 is disposed on the side of the connection portion 215 adjacent to the drive transistor T1, it may have a problem that the third via h3 and the first via h1 may be disposed on the same side of the second scan signal line S2 adjacent to the drive transistor T1. In one embodiment, the third via h3 is disposed on the side of the connection portion 215 away from the drive transistor T1, which may avoid the PPI decrease and may not increase the difficulty for forming the third via h3.

Figure 14:
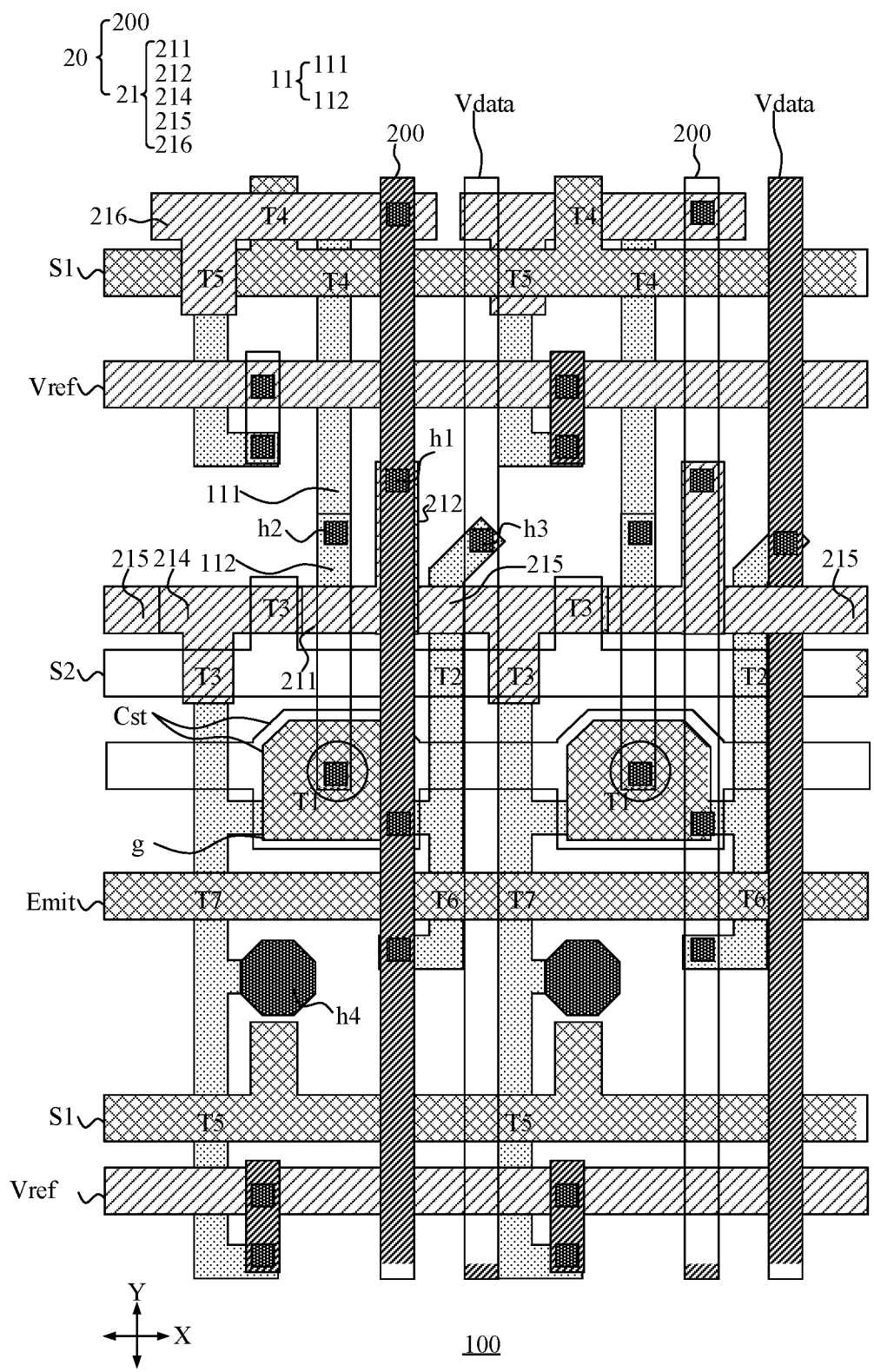

In some optional embodiments, as shown in FIG. 14, the branch portion 21 may further include a second blocking portion 216, and the pixel circuit may include the gate electrode initialization transistor T4. The connection relationship between the gate electrode initialization transistor T4 and the drive transistor T1 may be as the description in the above-mentioned embodiments, which may not be described in detail herein. The gate electrode initialization transistor T4 may be configured to provide a reset voltage for the gate electrode of the drive transistor T1 to reset the gate potential of the drive transistor T1. Exemplarily, the overlapped portion of the semiconductor portion of the gate electrode initialization transistor T4 and the first scan signal line S1 may be the channel of the gate electrode initialization transistor T4. Similarly, after the channel of the gate electrode initialization transistor T4 is irradiated by light, the leakage current of the gate electrode initialization transistor T4 may increase, which may result in that the gate potential of the drive transistor T1 is unstable to cause problems such as screen shaking. In various embodiments of the present application, the second blocking portion 216 may at least partially overlap the channel of the gate electrode initialization transistor T4. The second blocking portion 216 may be used to block light from irradiating the channel of the gate electrode initialization transistor T4, reduce the leakage current of the gate electrode initialization transistor T4, and further improve the stability of the gate potential of the drive transistor T1, thereby improving the display effect.

Exemplarily, as shown in FIG. 14, the second blocking portion 216 may also be connected to the main body portion 200 of the first signal line 20 through a via. The second blocking portion 216 may also be connected to the main body portion 200 of the first signal line 20 through the connection branch portion 212. If there is an overlapped portion of the second blocking portion 216 and the reference signal line Vref, in order to avoid signal crosstalk, the overlapped portion of the second shielding portion 216 and the reference signal line Vref may be disposed at different film layers.

Exemplarily, when the gate electrode initialization transistor T4 is a double gate transistor, the gate electrode initialization transistor T4 may have two channels, and the second blocking portion 216 may at least partially overlap both of two channels of the gate electrode initialization transistor T4.

Exemplarily, adjacent second shielding portions 216 corresponding to pixel circuits 10 at a same row may be connected with each other. Taking the main body portion of the first signal line 20 extending along the second direction Y as an example, the second blocking portion 216 may extend along the first direction X as a whole, and the plurality of main body portions 200 and the plurality of second blocking portions 216 may also grid-shaped first signal lines 20, which may further reduce the voltage drop of the first signal lines 20.

Exemplarily, the first branch portion 211, the connection branch portion 212, and the second blocking portion 216 may be located at a same film layer.

Figure 15:
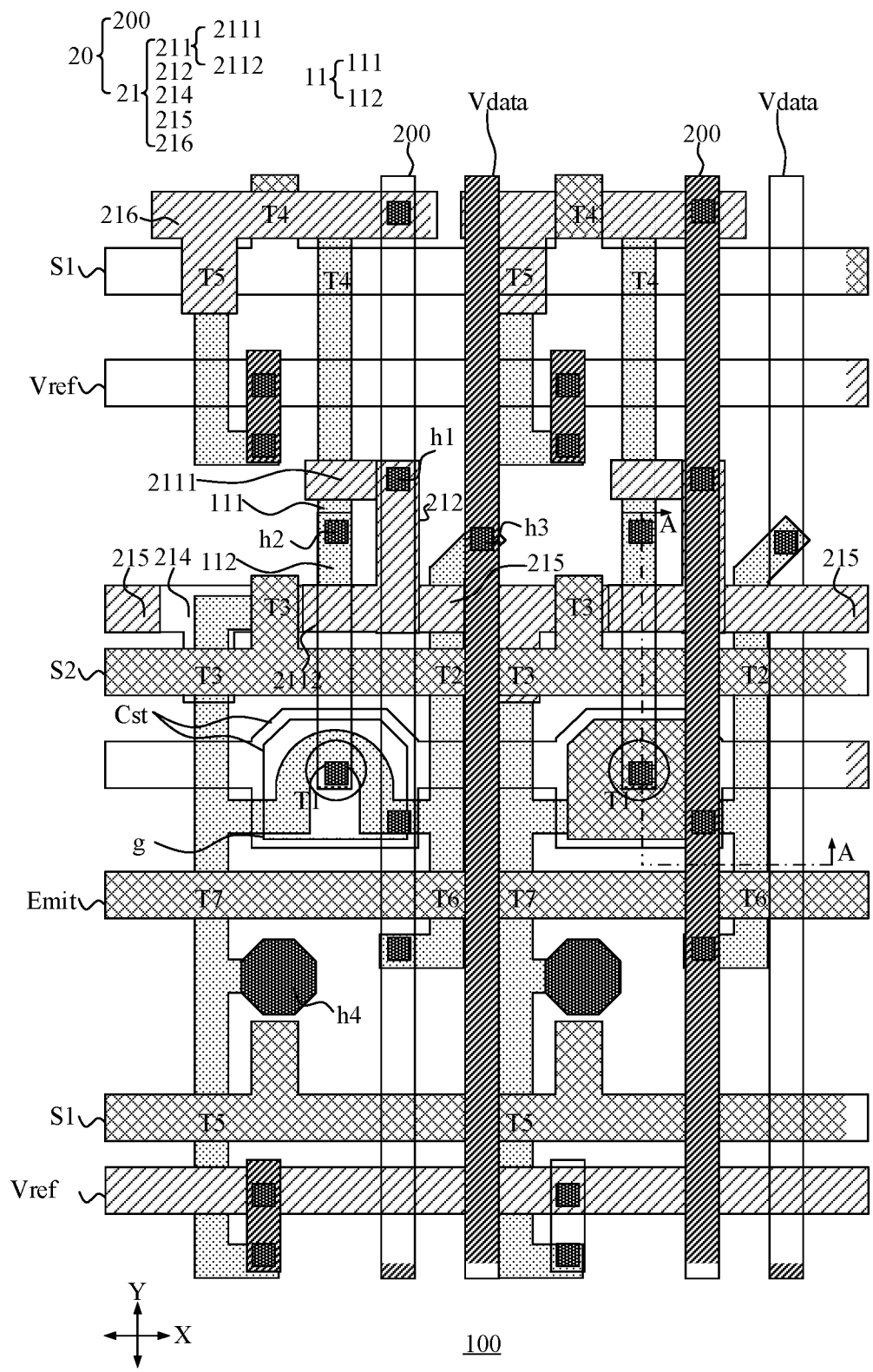

In some optional embodiments, as shown in FIG. 15, still taking the pixel circuit 10 including the gate electrode initialization transistor T4 as an example, the gate electrode initialization transistor T4 may be electrically connected to the gate electrode portion g of the drive transistor T1 through the first connection portion 11. The first connection portion 11 may include the first semiconductor connection portion 111 and the first metal connection portion 112; and the first semiconductor connection portion 111 and the first metal connection portion 112 may be connected through the second via h2.

The first branch portion 211 may include a first sub-branch portion 2111 and a second sub-branch portion 2112; the first sub-branch portion 2111 may be adjacent to the first via h1; and the first sub-branch portion 2111 may overlap the first semiconductor connection portion 111. The second sub-branch portion 2112 may be adjacent to the gate electrode portion g of the drive transistor T1; and the second sub-branch portion 2112 may overlap the first metal connection portion 112.

In various embodiments of the present application, the overlapped portion of the first sub-branch portion 2111 and the first semiconductor connection portion 111 may form an auxiliary storage capacitor, and the overlapped portion of the second sub-branch portion 2112 and the first metal connection portion 112 may form another auxiliary storage capacitor, which may increase the number of auxiliary storage capacitors and further increase the capacitance value of the capacitor electrically connected to the gate electrode portion g of the drive transistor T1 in the pixel circuit 10, thereby further increasing the stability of the gate potential of the drive transistor T1 and improving the display effect.

It can be understood that the auxiliary storage capacitor formed by the overlapped portion of the first sub-branch portion 2111 and the first semiconductor connection portion 111 may be in parallel with the auxiliary storage capacitor formed by the overlapped portion of the second sub-branch portion 2112 and the first metal connection portion 112.

Exemplarily, the first sub-branch portion 2111, the second sub-branch portion 2112 and the connection branch portion 212 may be located at a same film layer.

Figure 16:
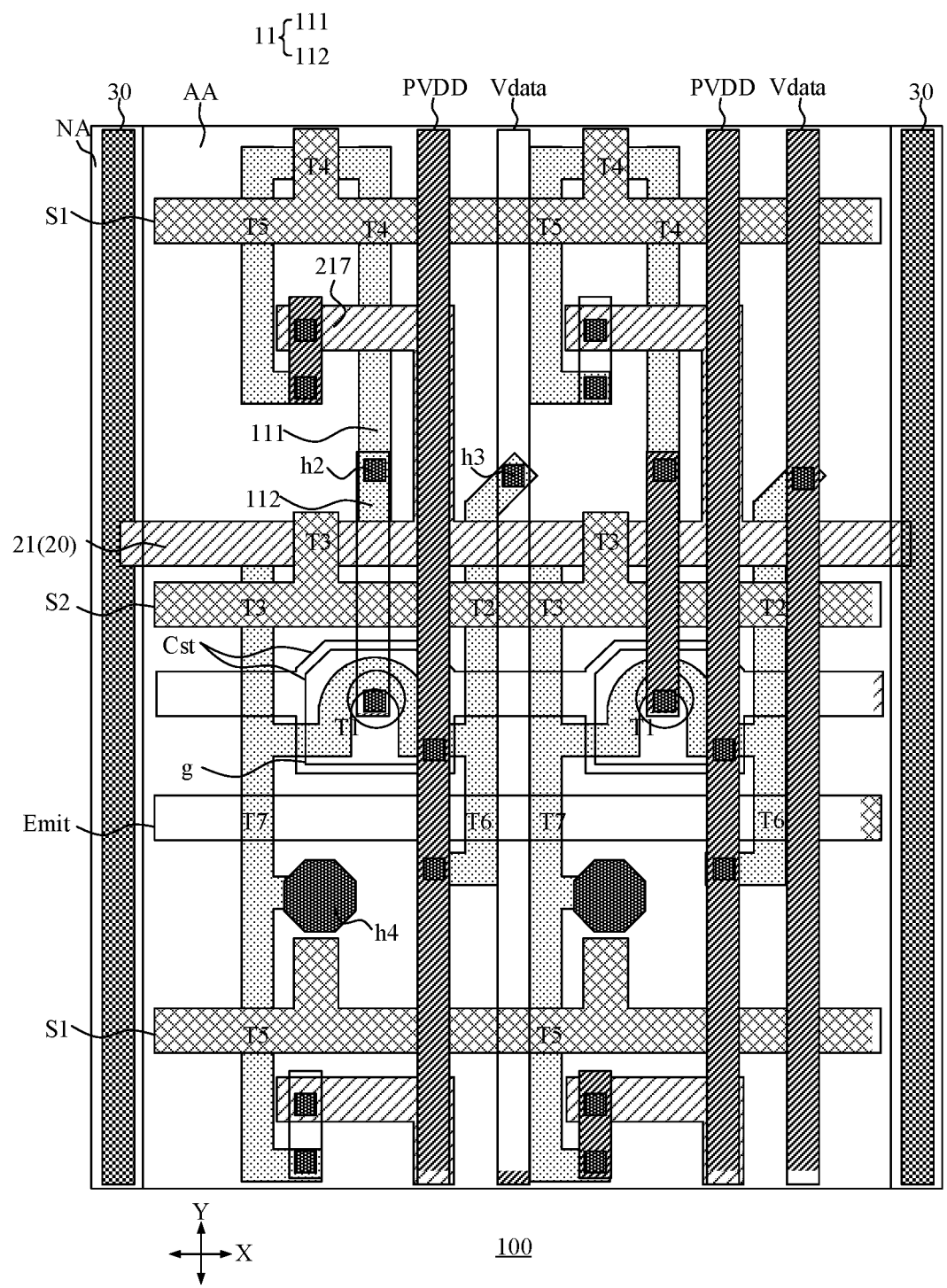

In some optional embodiments, as shown in FIG. 16, the array substrate 100 may have the display region AA and the non-display region NA. The pixel circuit may be disposed in the display region AA. The array substrate 100 may further include a signal bus 30 disposed in the non-display region; and the signal bus 30 may be configured to provide a reset voltage signal. Adjacent branch portions 21 corresponding to the pixel circuits at a same row may be connected with each other. That is, the branch portions 21 corresponding to the pixel circuits at a same row may form a wire extending along the row direction, and the branch portions 21 may be electrically connected to the signal bus 30. The embodiment shown in FIG. 11 may be understood as that the first signal line 20 may not include the main body portion. Furthermore, the branch portion 21 shown in FIG. 16 may be equivalent to being multiplexed into the reference signal line Vref shown in FIG. 1.

Exemplarily, the branch portion 21 may include a second connection branch portion 217. The pixel circuit may include the anode initialization transistor T5 and the gate electrode initialization transistor T4. The second connection branch portion 217 may be electrically connected to at least one of the anode initialization transistor T5 and the gate electrode initialization transistor T4. The reset voltage signal on the signal bus 30 may be transmitted to at least one of the anode initialization transistor T5 and the gate electrode initialization transistor T4 through the branch portion 21. It can be understood that the branch portion 21 in the embodiment shown in FIG. 16 may be equivalent to being multiplexed into the reference signal line Vref shown in FIG. 1, and the reference signal line Vref may not need to be disposed. It is equivalent to reducing the wiring of one reference signal line Vref and compressing the pitch along the second direction Y, thereby improving the PPI. Furthermore, since the wiring of one reference signal line Vref is reduced, it is equivalent to increasing the area of the light-transmitting region, thereby increasing the light transmittance.

Exemplarily, still taking the first connection portion 11 including the first semiconductor connection portion 111 and the first metal connection portion 112 as an example, the branch portion 21 and the first metal connection portion 112 may overlap to form an auxiliary storage capacitor; and the second connection branch portion 217 and the first semiconductor connection portion 111 may overlap to form another auxiliary storage capacitor. In such way, the number of auxiliary storage capacitors may be increased, and the capacitance of the capacitor electrically connected to the gate electrode portion g of the drive transistor T1 in the pixel circuit may be further increased, which may further increase the stability of the gate potential of the drive transistor T1, thereby improving the display effect.

Figure 17:
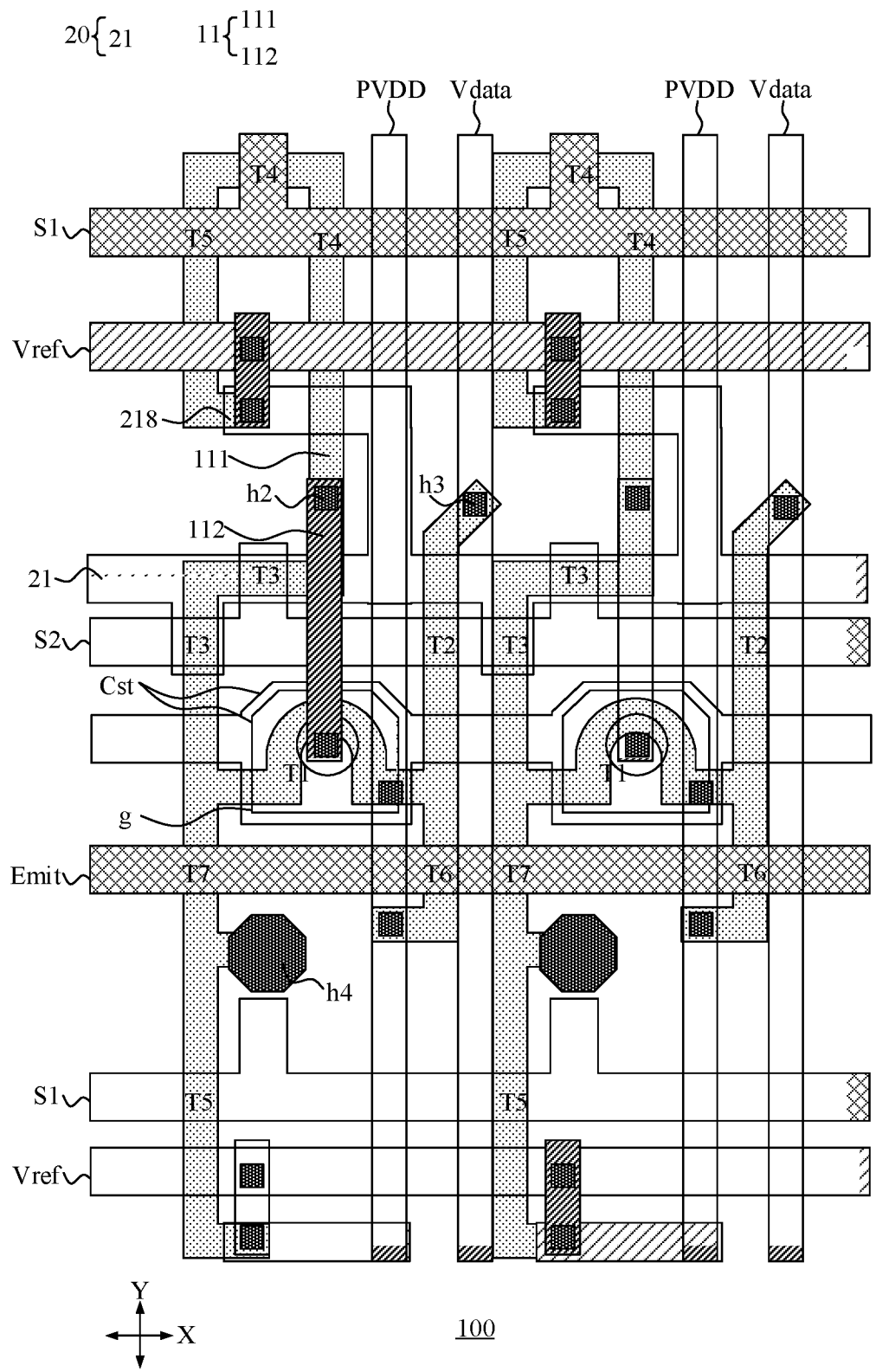

In some optional embodiments, as shown in FIG. 17, the pixel circuit may include the anode initialization transistor T5; and the branch portion 21 may be connected to the semiconductor portion of the anode initialization transistor T5 through a via. Exemplarily, the branch portion 21 may include a third connection branch portion 218; and the branch portion 21 may be connected to the semiconductor portion through the third connection branch portion 218. The semiconductor portion of the anode initialization transistor T5 may be also electrically connected to the reference signal line Vref. Therefore, the potential on the branch portion 21 and the potential on the reference signal line Vref may both be fixed potentials, such that the overlapped portion of the branch portion 21 and the first connection portion 11 may form the auxiliary storage capacitor.

Figure 18:
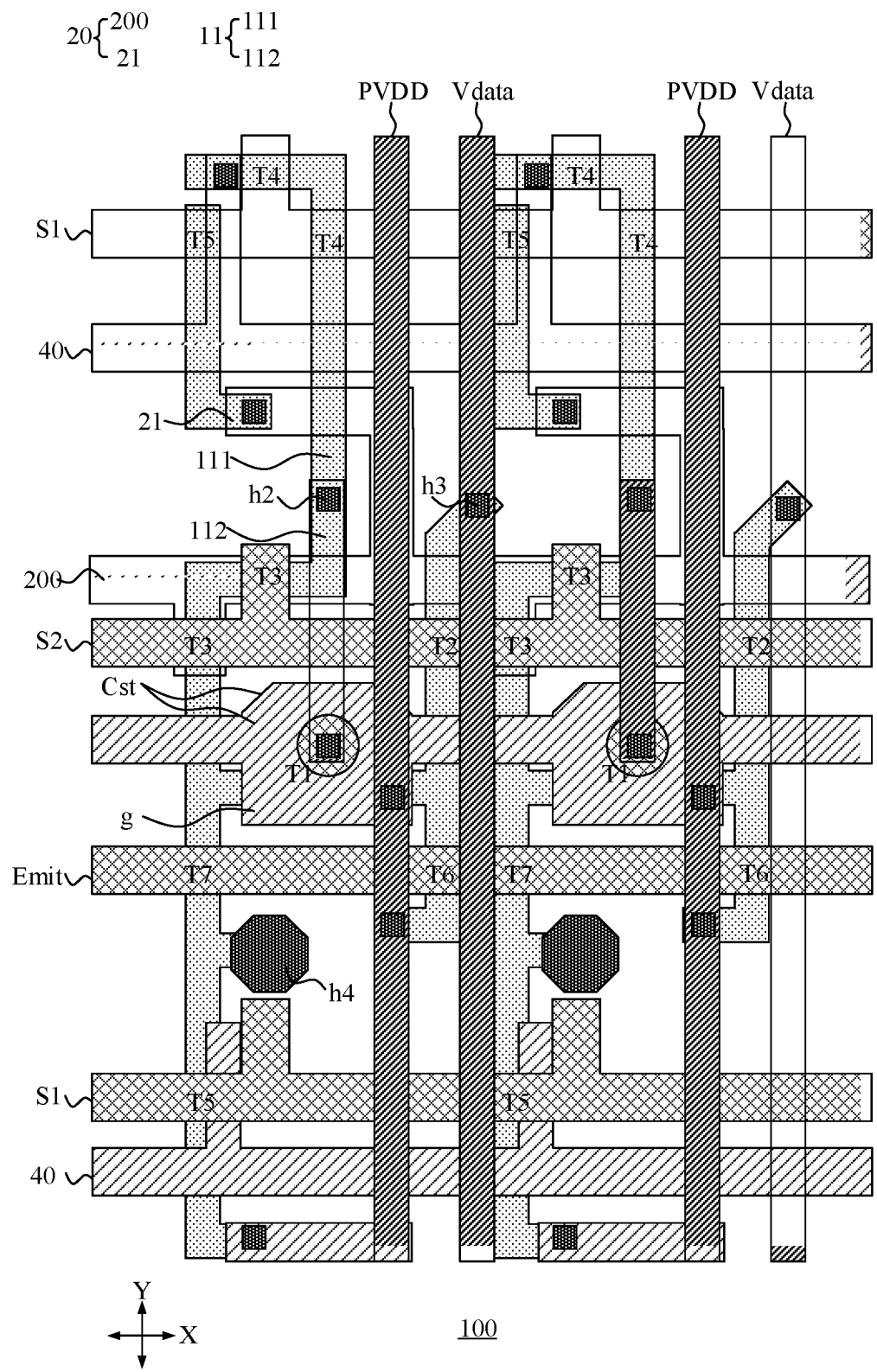

In some optional embodiments, as shown in FIG. 18, still taking the pixel circuit including the gate electrode initialization transistor T4 and the anode initialization transistor T5 as an example, the gate electrode initialization transistor T4 may be electrically connected to the gate electrode portion g of the drive transistor T1 through the first connection portion 11; and the array substrate 100 may further include second signal lines 40. The first signal line 20 may be configured to provide a first reset voltage signal, and the second signal line 40 may be configured to provide a second reset voltage signal. The first reset voltage signal and the second reset voltage signal may be different. The first signal line 20 may be electrically connected to the anode initialization transistor T5, and the second signal line 40 may be electrically connected to the gate electrode initialization transistor T4. In such way, different reset voltage signals may be provided for the anode initialization transistor T5 and the gate electrode initialization transistor T4, thereby satisfying the different reset requirements of the anode of the light-emitting element and the gate electrode of the drive transistor T1.

Exemplarily, as shown in FIG. 18, the first signal line 20 may include the main body portion 200; the branch portion 21 may be connected to the main body portion; and the branch portion 21 may be connected to the semiconductor portion of the anode initialization transistor T5 through a via.

Figure 19:
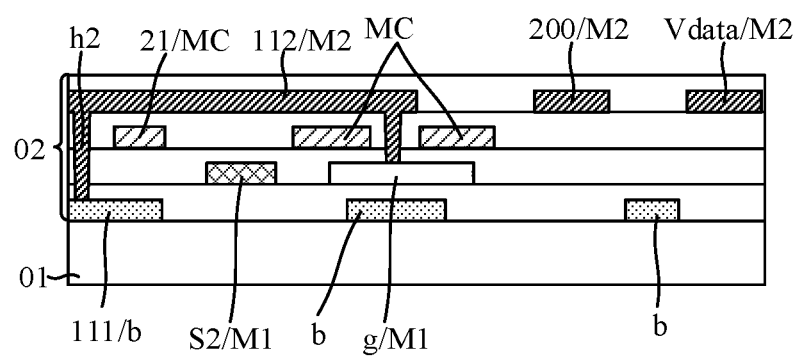
FIG. 19 illustrates a cross-sectional structural schematic along an AA direction in FIG. 15.

In some optional embodiments described above, as shown in FIG. 19, the array substrate may include the substrate 01 and the device layer 02 disposed on the substrate. The device layer 02 may include the gate electrode metal layer M1, the capacitor metal layer MC, and the source/drain metal layer M2 stacked along the direction away from the substrate 01. Exemplarily, the semiconductor layer b may be disposed between the gate electrode metal layer M1 and the substrate 01. An insulation layer may be disposed between the metal layers and between the semiconductor layer b and the gate electrode metal layer M1.

In the present disclosure, a plate of the storage capacitor Cst may at least partially overlap the gate electrode of the drive transistor T1. That is, in the present disclosure, one plate of the storage capacitor Cst may be disposed at the gate electrode metal layer M1, and the other plate may be disposed at the capacitor metal layer MC, where the source and drain electrodes of the drive transistor T1 may not be shown in FIG. 19.

In some optional embodiments, the branch portion 21 may be disposed at the capacitor metal layer MC. The branch portion 21 and the other plate of the storage capacitor Cst may be made of a same material, such that the branch portion 21 and the other plate of the storage capacitor Cst may be formed in a same process step simultaneously.

Exemplarily, the first semiconductor connection portion 111 and the first metal connection portion 112 of the first connection portion 11 may be connected with each other through the second via h2. The first semiconductor connection portion 111 may be disposed at the semiconductor layer b, and the first metal connection portion 112 of the first connection portion 11 may be disposed at the source/drain metal layer M2. Furthermore, the first metal connection portion 112 may be connected to the gate electrode portion g of the drive transistor T1 through a via.

Figure 20:
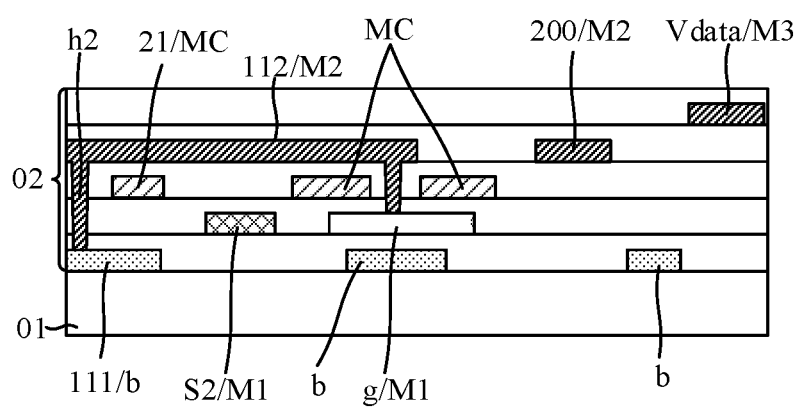
FIG. 20 illustrates another cross-sectional structural schematic along an AA direction in FIG. 15.

In other optional embodiments, as shown in FIG. 20, the device layer 02 may further include a wiring metal layer M3 on the side of the source/drain metal layer M2 facing away from the substrate. The wiring metal layer M3 may be any metal conductive layer on the side of the source/drain metal layer M2 away from the substrate 01 in the device layer 02. Different from that shown in FIG. 19, the data signal line Vdata may be disposed at the wiring metal layer M3. In such way, the distance between the data signal line Vdata and the second via h2 may be larger, and the coupling capacitance between the data signal line Vdata and the second via h2 may be reduced, thereby, for example, reducing crosstalk under high frequency driving.

Figure 21:
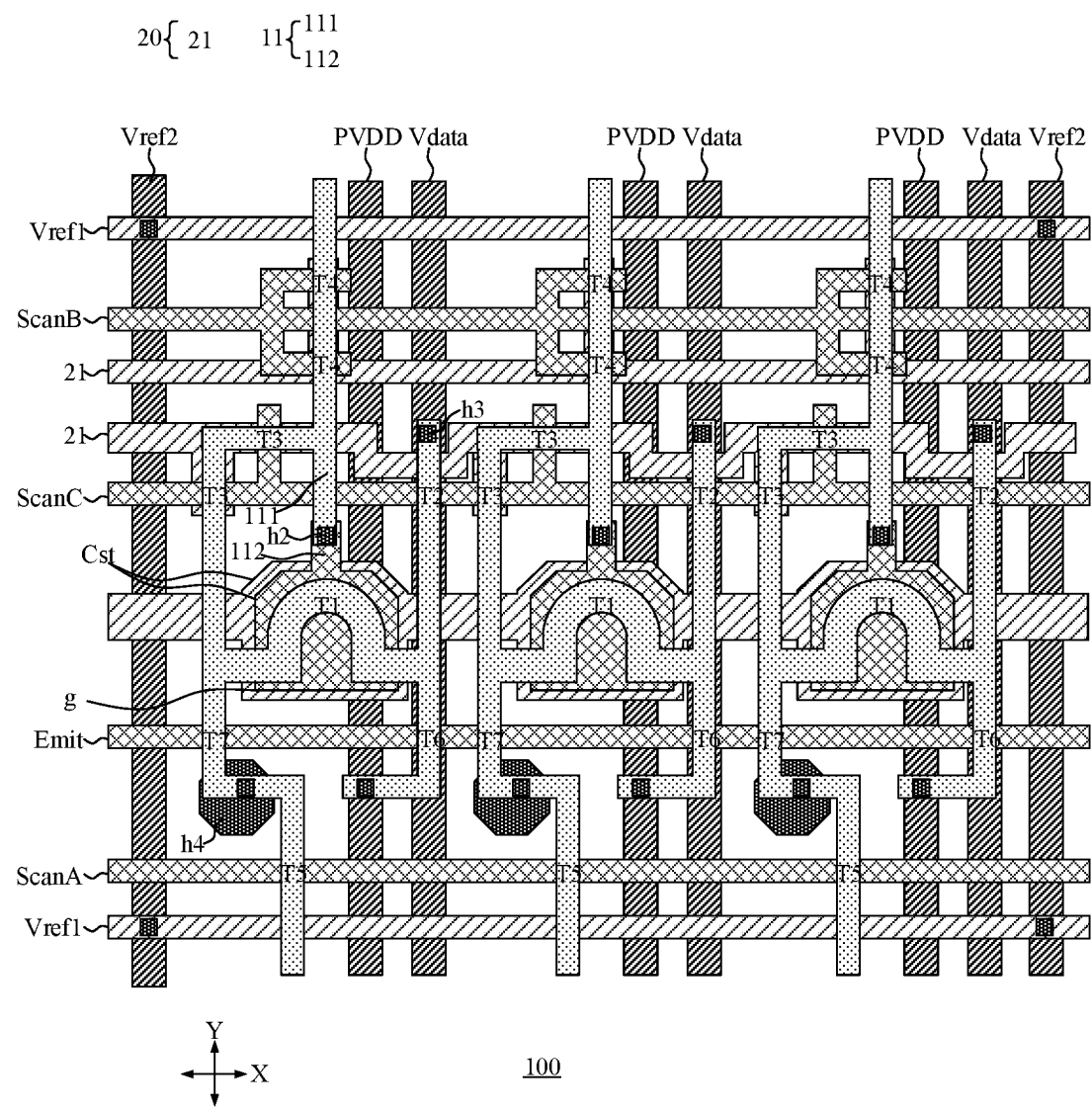
FIG. 21 illustrates another schematic top view of a local layout of an array substrate according to various embodiments of the present disclosure.
Figure 22:
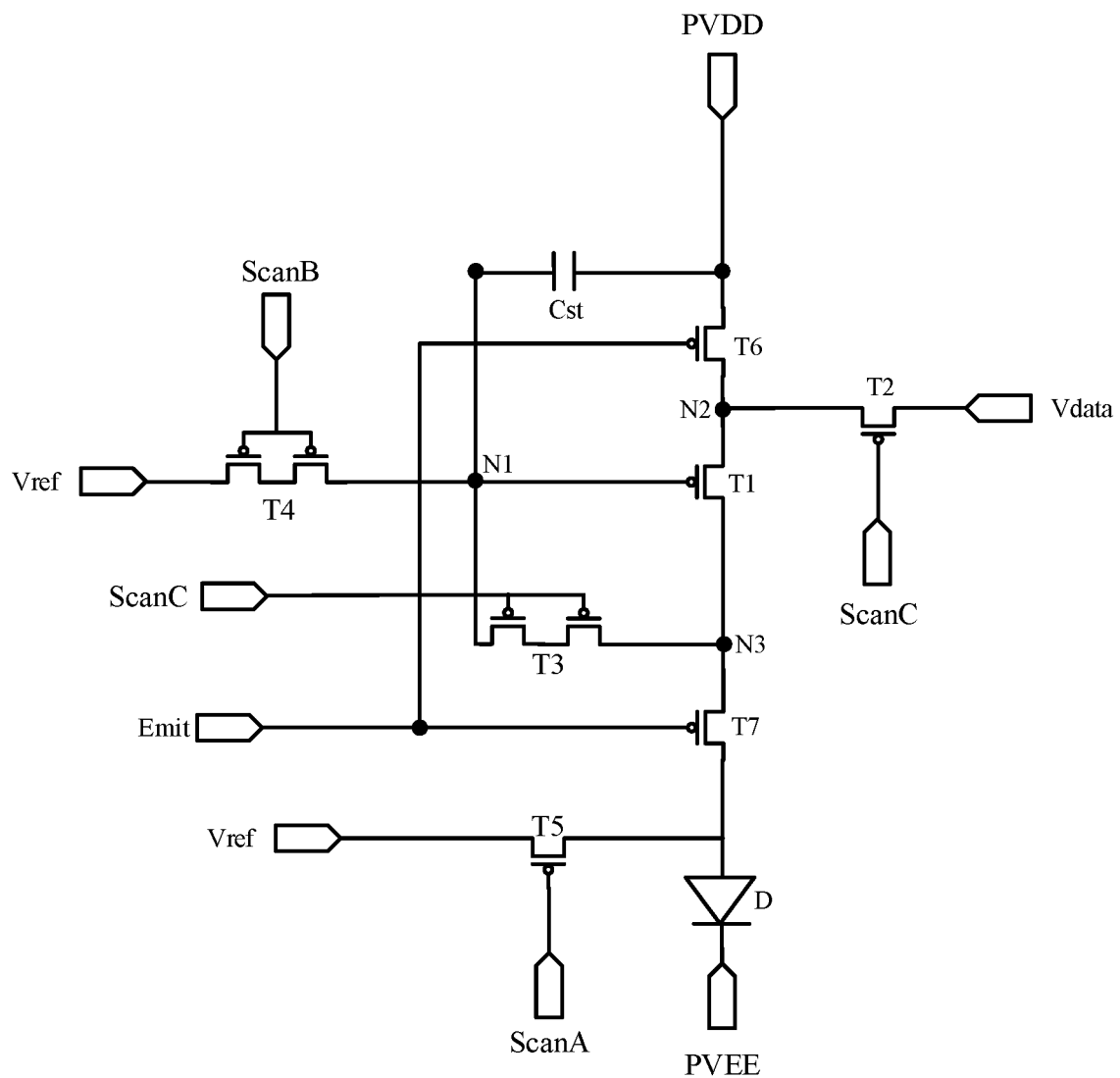
FIG. 22 illustrates another circuit structural diagram of a pixel circuit according to various embodiments of the present disclosure.

In other optional embodiments, the layout of the array substrate may also be shown in FIG. 21, and the circuit structure of the pixel circuit 10 may also be shown in FIG. 22. The similarities between FIGS. 21-22 and FIGS. 2 and 6 may not be repeated in detail herein. The differences may be described as the following. On the one hand, the reference signal line in FIG. 21 may include a first reference signal line Vref1 extending along the first direction X and a second reference signal line Vref2 extending along the second direction Y; the first reference signal lines Vref1 and the second reference signal lines Vref2 may be electrically connected with each other to define a plurality of pixel regions; and three pixel circuits 10 arranged along the first direction X may be disposed in one pixel region. On the other hand, the input terminal of the gate electrode initialization transistor T4 in the pixel circuit 10 of a current row in FIG. 21 may be electrically connected to the first reference signal line Vref1 corresponding to the pixel circuit 10 of the current row; and the fourth via h4 in the pixel circuit 10 of the current row may be electrically connected to the anode initialization transistor T5 in the pixel circuit 10 of the current row. On the other hand, the gate electrode initialization transistor T4 and the anode initialization transistor T5 in FIGS. 21-22 may be connected to different scan signal lines. For example, the anode initialization transistor T5 may be connected to a first scan signal line ScanA; the gate electrode initialization transistor T4 may be connected to a second scan signal line ScanB; and the data write transistor T2 and the compensation transistor T3 may be connected to a third scan signal line ScanC.

Exemplarily, the first reference signal line Vref1 may be disposed at the semiconductor layer of the array substrate.

The branch portion 21 in FIG. 21 may be same as those in any one of the embodiments in FIGS. 1-15, which may not be repeated in detail herein.

Furthermore, as shown in FIG. 21, a row of pixel circuits may include two branch portions 21 extending along the first direction X as a whole, and the two branch portions 21 may both overlap the first connection portion 11. One of the branch portions 21 may at least partially overlap the channel of the compensation transistor T3, and the other branch 21 may at least partially overlap the channel of the gate electrode initialization transistor T4.

Exemplarily, the first metal connection portion 112 in FIG. 21 may be disposed at the gate electrode metal layer M1.

Exemplarily, the array substrate shown in FIGS. 6-18 may be used in a small-sized display panel, and the array substrate shown in FIG. 21 may be used in a large-sized display panel.

It should be noted that various embodiments provided in the present disclosure may be combined with each other in the case that there is no contradiction.

Figure 23:
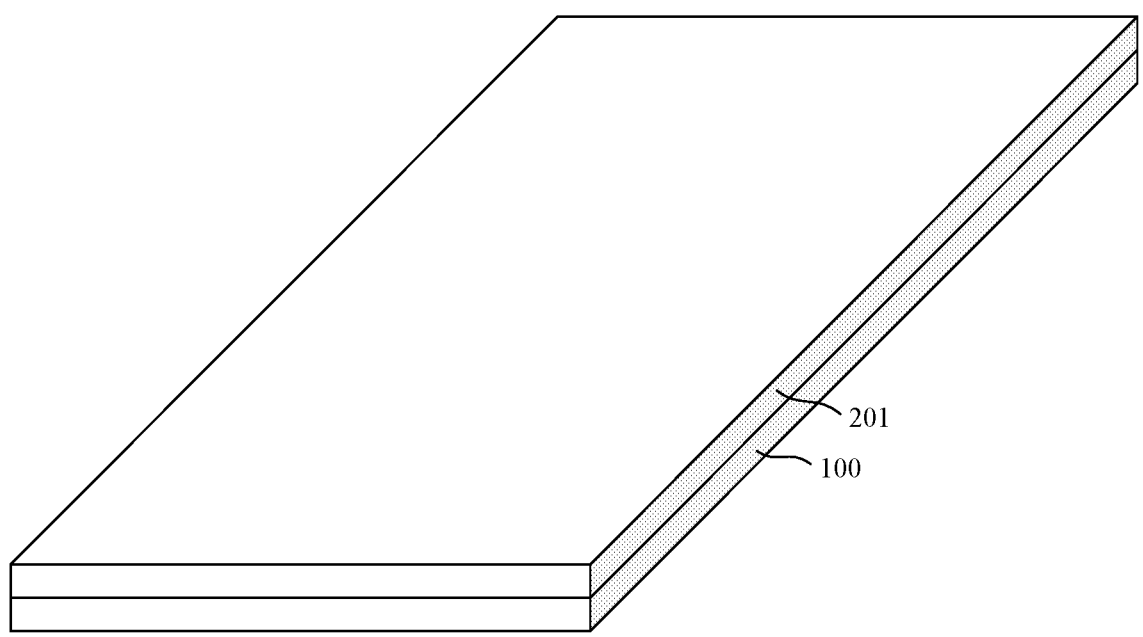
FIG. 23 illustrates a structural schematic of a display panel according to various embodiments of the present disclosure.

Various embodiments of the present application further provide a display panel which may include the array substrate as described in any of above-mentioned embodiments of the present disclosure. FIG. 23 illustrates a structural schematic of a display panel according to various embodiments of the present disclosure. As shown in FIG. 23, a display panel may include the array substrate 100 described in any of the above-mentioned embodiments and a light-emitting layer 201 on the array substrate 100. Exemplarily, the light-emitting layer 201 may be an organic light-emitting layer, that is, the display panel may be an organic light-emitting diode (OLED) display panel.

Figure 24:
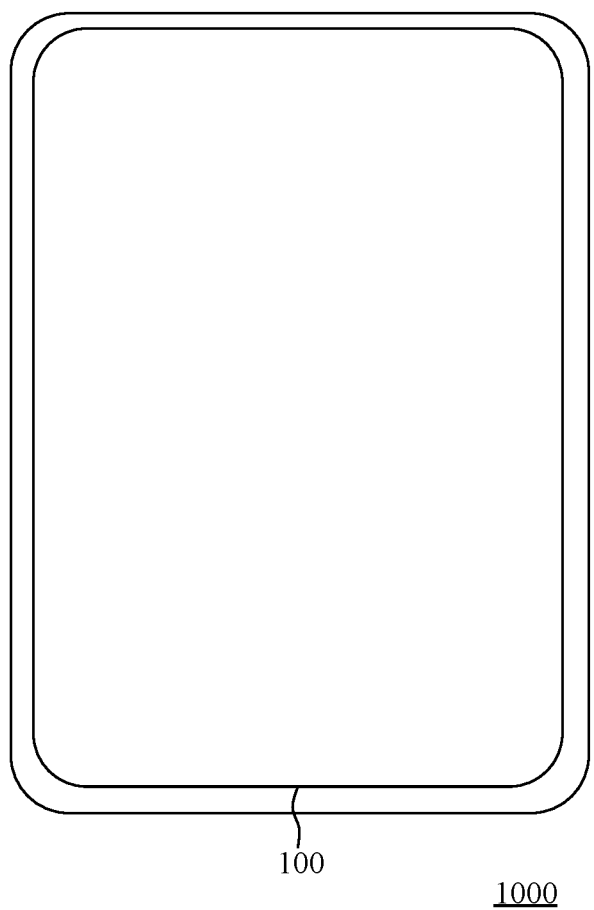
FIG. 24 illustrates a structural schematic of a display device according to various embodiments of the present disclosure.

Various embodiments of the present application also provide a display device, including the array substrate provided in above-mentioned embodiments of the present application. Referring to FIG. 24, FIG. 24 illustrates a structural schematic of a display device according to various embodiments of the present disclosure. A display device 1000 provided in FIG. 24 may include the array substrate 100 provided in any one of the above-mentioned embodiments of the present application. A mobile phone may be taken as an example to illustrate the display device 1000 in one embodiment of FIG. 24. It can be understood that the display device provided in various embodiments of the present application may be a device including a wearable product, a computer, a television, a vehicle-mounted display device, or other display devices with a display function, which may not be limited according to various embodiments of the present application. The display device provided in various embodiments of the present application may have the beneficial effects of the array substrate provided in various embodiments of the present application; and reference may be made to the description of the array substrate in above-mentioned embodiments of the present application, which may not be described in detail herein.

From the above-mentioned embodiments, it can be seen that the array substrate, the display panel and the display device provided by the present disclosure may achieve at least the following beneficial effects.

According to various embodiments of the present application, the first signal line may include the branch portion, and the first signal line may be electrically connected to the fixed voltage terminal, such that the potential on the branch portion may be same as the potential on the first signal line and both potentials may be fixed potentials; and the first connection portion may be electrically connected to the gate electrode portion of the drive transistor, and the branch portion may at least partially overlap the first connection portion, such that the overlapped portion of the branch portion and the first connection portion may form the auxiliary storage capacitor of the pixel circuit. Therefore, the capacitor electrically connected to the gate electrode portion of the drive transistor in the pixel circuit may include both the storage capacitor and the auxiliary storage capacitor formed by the overlapped portion of the branch portion and the first connection portion, and the capacitance value of the capacitor electrically connected to the gate electrode of the drive transistor in the pixel circuit may be increased, thereby increasing the stability of the gate potential of the driving transistor to improve the display effect.

According to the above-mentioned embodiments of the present application, those embodiments may not be describe in detail, and the present application may not be limited only to above-mentioned embodiments. Obviously, some modifications and changes may be made based on the above-mentioned description. Those embodiments may be selected and described to better explain the principles and practical applications of the present application, such that those skilled in the art may make suitable use of the present application and modification based on the present application. The present application may only be limited by the claims and their corresponding full scope and equivalents.

What is claimed is:

1. An array substrate, comprising:
a plurality of pixel circuits arranged in an array; and
a first signal line electrically connected to a pixel circuit of the plurality of pixel circuits, wherein the first signal line includes a branch portion; and the pixel circuit includes a storage capacitor, a drive transistor, and a first connection portion electrically connected to a gate electrode portion of the drive transistor, wherein:
one plate of the storage capacitor at least partially overlaps the gate electrode portion of the drive transistor;
the branch portion at least partially overlaps the first connection portion;
the branch portion includes a connection branch portion and a first branch portion;
the connection branch portion is electrically connected to a main body portion of the first signal line through a first via;
the first branch portion at least partially overlaps the first connection portion;
the pixel circuit includes a gate electrode initialization transistor and a data write transistor; the gate electrode initialization transistor is electrically connected to the gate electrode portion of the drive transistor through the first connection portion; the first connection portion includes a first semiconductor connection portion and a first metal connection portion; the first semiconductor connection portion is connected to the first metal connection portion through a second via; and the data write transistor is connected to a data signal line through a third via; and
the branch portion further includes a second branch portion; and an orthographic projection of the second branch portion on a plane of the array substrate is between orthographic projections of the second via and the third via on the plane of the array substrate.

2. The array substrate according to claim 1, wherein:
the second via is on a side of the first branch portion away from the drive transistor.

3. The array substrate according to claim 1, wherein:
an orthographic projection of the connection branch on a plane of the array substrate is between orthographic projections of the second via and the third via on the plane of the array substrate; and the first via is on a side of the second via away from the drive transistor.

4. The array substrate according to claim 1, wherein:
the branch portion further includes a first blocking portion; the pixel circuit includes a compensation transistor; and the first blocking portion at least partially overlaps a channel of the compensation transistor.

5. The array substrate according to claim 1, wherein:
the branch portion further includes a second blocking portion; the pixel circuit includes a gate electrode initialization transistor; and the second blocking portion at least partially overlaps a channel of the gate electrode initialization transistor.

6. The array substrate according to claim 1, wherein:
the branch portion furthers include a connection portion; and adjacent branch portions corresponding to pixel circuits in a same row are connected with each other through the connection portion.

7. The array substrate according to claim 6, wherein:
the pixel circuit includes a data write transistor; the data write transistor is connected to a data signal line through a third via; and the third via is on a side of the connection portion away from the drive transistor.

8. The array substrate according to claim 1, wherein:
the first signal line is a power signal line; and the first signal line is configured to provide a power voltage to the drive transistor.

9. The array substrate according to claim 1, wherein:
the first branch portion includes a first sub-branch portion and a second sub-branch portion; the first sub-branch portion is adjacent to the first via and overlaps the first semiconductor connection portion; and the second sub-branch portion is adjacent to the gate electrode portion of the drive transistor and overlaps the first metal connection portion.

10. The array substrate according to claim 1, wherein:
the first signal line is a reference signal line; and the reference signal line is configured to provide a reset voltage signal.

11. The array substrate according to claim 1, further including:
a signal bus at a non-display region, wherein adjacent branch portions corresponding to pixel circuits at a same row are connected with each other; the branch portion is electrically connected to the signal bus; and the signal bus is configured to provide a reset voltage signal.

12. The array substrate according to claim 1, wherein:
the pixel circuit includes an anode initialization transistor; and the branch portion is connected to a semiconductor portion of the anode initialization transistor through a via.

13. The array substrate according to claim 1, wherein:
the pixel circuit includes a gate electrode initialization transistor and an anode initialization transistor; the gate electrode initialization transistor is electrically connected to the gate electrode portion of the drive transistor through the first connection portion; the array substrate further includes a second signal line; the first signal line is electrically connected to the anode initialization transistor, and the second signal line is electrically connected to the gate electrode initialization transistor; and the first signal line is configured to provide a first reset voltage signal, and the second signal line is configured to provide a second reset voltage signal.

14. The array substrate according to claim 1, further including:
a substrate and a device layer disposed on the substrate, wherein the device layer includes a gate electrode metal layer, a capacitor metal layer, and a source/drain metal layer stacked along a direction away from the substrate; and the branch portion is disposed at the capacitor metal layer.

15. The array substrate according to claim 14, further including:
a data signal line, wherein the device layer further includes a wiring metal layer on a side of the source/drain metal layer facing away from the substrate; and the data signal line is disposed at the wiring metal layer.

16. A display panel, comprising:
an array substrate, comprising:
a plurality of pixel circuits arranged in an array; and
a first signal line electrically connected to a pixel circuit of the plurality of pixel circuits, wherein the first signal line includes a branch portion; and the pixel circuit includes a storage capacitor, a drive transistor, and a first connection portion electrically connected to a gate electrode portion of the drive transistor, wherein:
one plate of the storage capacitor at least partially overlaps the gate electrode portion of the drive transistor;
the branch portion at least partially overlaps the first connection portion;
the branch portion includes a connection branch portion and a first branch portion;
the connection branch portion is electrically connected to a main body portion of the first signal line through a first via;
the first branch portion at least partially overlaps the first connection portion;
the pixel circuit includes a gate electrode initialization transistor and a data write transistor; the gate electrode initialization transistor is electrically connected to the gate electrode portion of the drive transistor through the first connection portion; the first connection portion includes a first semiconductor connection portion and a first metal connection portion; the first semiconductor connection portion is connected to the first metal connection portion through a second via; and the data write transistor is connected to a data signal line through a third via; and
the branch portion further includes a second branch portion; and an orthographic projection of the second branch portion on a plane of the array substrate is between orthographic projections of the second via and the third via on the plane of the array substrate.

17. A display device, comprising:
a display panel, comprising:
an array substrate, comprising:
a plurality of pixel circuits arranged in an array; and
a first signal line electrically connected to a pixel circuit of the plurality of pixel circuits, wherein the first signal line includes a branch portion; and the pixel circuit includes a storage capacitor, a drive transistor, and a first connection portion electrically connected to a gate electrode portion of the drive transistor, wherein:
one plate of the storage capacitor at least partially overlaps the gate electrode portion of the drive transistor;
the branch portion at least partially overlaps the first connection portion;
the branch portion includes a connection branch portion and a first branch portion;
the connection branch portion is electrically connected to a main body portion of the first signal line through a first via;
the first branch portion at least partially overlaps the first connection portion;
the pixel circuit includes a gate electrode initialization transistor and a data write transistor; the gate electrode initialization transistor is electrically connected to the gate electrode portion of the drive transistor through the first connection portion; the first connection portion includes a first semiconductor connection portion and a first metal connection portion; the first semiconductor connection portion is connected to the first metal connection portion through a second via; and the data write transistor is connected to a data signal line through a third via; and
the branch portion further includes a second branch portion; and an orthographic projection of the second branch portion on a plane of the array substrate is between orthographic projections of the second via and the third via on the plane of the array substrate.

* * * * *